(12) United States Patent　　(10) Patent No.: US 12,660,351 B2
Kim et al.　　(45) Date of Patent: Jun. 16, 2026

(54) IMAGE SENSOR COMPRISING DEEP DEVICE ISOLATION PATTERN

(71) Applicant: SAMSUNG ELECTRONICS CO., LTD., Suwon-si (KR)

(72) Inventors: Kook Tae Kim, Hwaseong-si (KR); Jingyun Kim, Seogwipo-si (KR); Jonghyeon Noh, Hwaseong-si (KR); Miseon Park, Hwaseong-si (KR); Jaewoong Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 773 days.

(21) Appl. No.: 17/881,862

(22) Filed: Aug. 5, 2022

(65) Prior Publication Data

US 2023/0131769 A1　　Apr. 27, 2023

(30) Foreign Application Priority Data

Oct. 27, 2021　(KR) ........................ 10-2021-0144278

(51) Int. Cl.
　H10F 39/12　　(2025.01)
　H10F 39/00　　(2025.01)
(52) U.S. Cl.
　CPC ......... H10F 39/807 (2025.01); H10F 39/011 (2025.01); H10F 39/199 (2025.01);
　(Continued)
(58) Field of Classification Search
　CPC .............. H10F 39/199; H10F 39/8053; H10F 39/8063; H10F 39/807
　See application file for complete search history.

(56) References Cited

U.S. PATENT DOCUMENTS 9,190,441 B2　11/2015　Lai et al.
9,728,570 B2　　8/2017　Chiang et al.
(Continued)

FOREIGN PATENT DOCUMENTS

KR　　　10-0670606　　　1/2007
KR　10-2020-0087544 A　7/2020
KR　10-2021-0075973 A　6/2021

OTHER PUBLICATIONS

Office Action dated Jul. 9, 2025 issued in corresponding Korean Patent Application No. 10-2021-0144278.

*Primary Examiner* — Yara B Green
*Assistant Examiner* — Christopher M Roland
(74) *Attorney, Agent, or Firm* — Morgan, Lewis & Bockius LLP

(57)　　　　ABSTRACT

An image sensor includes: a substrate including a plurality of pixel regions, a first surface and a second surface opposite to the first surface; and a deep device isolation pattern disposed between adjacent pixel regions of the plurality of pixel regions and penetrating the substrate, wherein the deep deice isolation pattern includes: a semiconductor pattern extended from the second surface toward the first surface; and sidewall insulating patterns interposed between the semiconductor pattern and the substrate, wherein the semiconductor pattern includes sidewall portions and a filling portion, wherein the sidewall portions are provided adjacent to the sidewall insulating patterns, respectively, wherein the filling portion is provided between the sidewall portions, and wherein top surfaces of the sidewall portions are located at a height higher than a top surface of the filling portion,

10 Claims, 33 Drawing Sheets

(52) U.S. Cl.
CPC ........ _H10F 39/811_ (2025.01); _H10F 39/8053_
(2025.01); _H10F 39/8063_ (2025.01)

(56) References Cited

U.S. PATENT DOCUMENTS

| | | | | |
|---|---|---|---|---|
| 10,008,535 | B2 | 6/2018 | Lee et al. | |
| 10,700,114 | B2 | 6/2020 | Honda et al. | |
| 10,840,285 | B2 | 11/2020 | Kim et al. | |
| 10,861,891 | B2 | 12/2020 | Kim et al. | |
| 11,004,889 | B2 | 5/2021 | Park et al. | |
| 12,107,112 | B2 | 10/2024 | Oshiyama et al. | |
| 2012/0033119 | A1* | 2/2012 | Shinohara | H10F 39/024 |
| | | | | 257/E31.119 |
| 2016/0163749 | A1* | 6/2016 | Yang | H10D 86/201 |
| | | | | 257/446 |
| 2016/0225802 | A1* | 8/2016 | Lin | H10F 39/024 |
| 2017/0170229 | A1* | 6/2017 | Oh | H10F 39/807 |
| 2019/0252425 | A1 | 8/2019 | Ogawa | |
| 2020/0144316 | A1 | 5/2020 | Kim et al. | |
| 2020/0219911 | A1 | 7/2020 | Hur et al. | |
| 2020/0227449 | A1* | 7/2020 | Kim | H10F 39/807 |
| 2021/0193706 | A1* | 6/2021 | Kim | H10F 39/199 |
| 2022/0077204 | A1* | 3/2022 | Lee | H10F 39/802 |
| 2022/0310675 | A1* | 9/2022 | Kim | H10F 39/8063 |
| 2022/0310676 | A1* | 9/2022 | Kim | H10F 39/811 |
| 2023/0170370 | A1* | 6/2023 | Park | H10F 39/807 |
| | | | | 257/446 |
| 2023/0170371 | A1* | 6/2023 | Lee | H10F 39/014 |
| 2025/0126916 | A1* | 4/2025 | Kim | H10F 39/807 |

\* cited by examiner

IMAGE SENSOR COMPRISING DEEP DEVICE ISOLATION PATTERN

CROSS-REFERENCE TO RELATED APPLICATION

This U.S. non-provisional patent application claims priority under 35 U.S.C. § 119 to Korean Patent Application No. 10-2021-0144278, filed on Oct. 27, 2021, in the Korean Intellectual Property Office, the disclosure of which is incorporated by reference herein in its entirety

TECHNICAL FIELD

The present inventive concept relates to an image sensor and a method of fabricating the same, and in particular, to a complementary metal oxide semiconductor ((MOS) image sensor.

DISCUSSION OF THE RELATED ART

Generally, an image sensor is a semiconductor device converts an optical image to electric signals based on incident light. With the recent development of the computer and communication industries, there is an increasing demand for high-performance image sensors in a variety of applications such as digital cameras, camcorders, personal communication systems, gaming macs canes security cameras, micro-cameras for medical applications, and/or robots. The image sensor may be classified as either a charge coupled device (CCD) type or a complementary metal oxide semiconductor (CMOS) type. In general, the CMOS-type image sensor (CIS) may include a plurality of two-dimensionally-arranged pixels. Each of the pixels may include a photodiode (PD) that coverts it light into an electrical signal. Typically, the pixels may be provided between a deep isolation pattern.

SUMMARY

According to an exemplary embodiment of the present inventive concept, at image sensor includes: a substrate including a plurality of pixel regions, a first surface and a second surface opposite to the first surface; and a deep device isolation pattern disposed between adjacent pixel regions of the plurality of pixel regions and penetrating the substrate, wherein the deep device isolation pattern includes: a semiconductor pattern extended from the second surface toward the first surface; and sidewall insulating patterns interposed between the semiconductor pattern and the substrate, wherein the semiconductor pattern includes sidewall portions and a filling portion, wherein the sidewall portions are provided adjacent to the sidewall insulating patterns, respectively, wherein the filling portion is provided between the sidewall portions, and wherein top surfaces of the sidewall portions are located at a height higher than a top surface of the tilling portion.

According to an exemplary embodiment of the present inventive concept, a method of fabricating an image sensor includes: providing a substrate including a plurality of pixel regions, a first surface, and a second surface opposite; forming a deep trench extending from the first surface into the substrate; forming a sidewall insulating layer covering an inner surface of the deep trench, and forming a preliminary semiconductor pattern on the sidewall insulating layer, wherein the preliminary semiconductor pattern covers a portion of the deep trench, wherein the preliminary semiconductor pattern includes a first portion and a second portion, wherein the first portion is provided in the deep trench and covers the sidewall insulating layer, wherein the second portion is provided on the first portion and fills a lower portion of the deep trench, and wherein a top surface of the first portion is located at a height higher than a top surface of the second portion.

BRIEF DESCRIPTION OF THE DRAWINGS

FIGS. 4A and 48 are sectional views, each of which is taken along a line A-A' of FIG. 3, to illustrate art image sensor according to an exemplary embodiment of the present inventive concept.

FIGS. 5A, 58, 6A, 6B, 6C. 6D, 7A, and 7B are enlarged sectional views illustrating a portion 'P2' of FIG. 4A

DETAILED DESCRIPTION OF THE EMBODIMENTS

Exemplary embodiments of the present inventive concept will now be described more fully with reference to the accompanying drawings.

Figure 1:
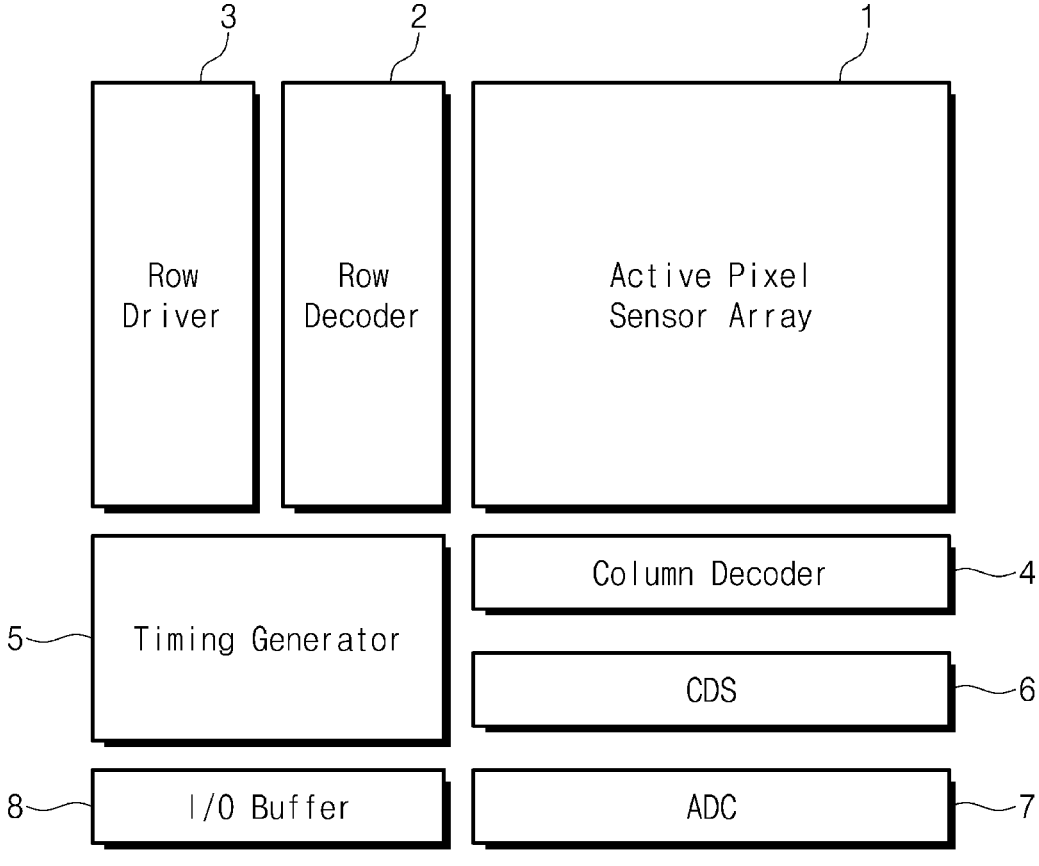
FIG. 1 is a block diagram schematically illustrating an image sensor according to an exemplary embodiment of the present inventive concept.

FIG. 1 is a block diagram schematically illustrating an image sensor according to an exemplary embodiment of the present inventive concept.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of pixels, which are two-dimensionally arranged and are used to convert optical signals into electrical signals. The active pixel sensor array 1 may be driven by a plurality of driving signals (e.g., pixel selection signals, reset signals, and charge transfer signals) provided from the row driver 3. In addition, the electrical signals, which are convened by the active pixel sensor array 1, may be provided to the CDS 6

The row driver 3 may provide a plurality of driving signals, which are used to drive the pixels, to the active pixel sensor array 1, based on results decoded by the row decoder 2. In the case where the pixels are arranged in a matrix shape, the driving signals may be applied to respective rows of the pixels.

The timing generator 5 may be configured to provide a timing signal and a control signal to the row decoder 2 and the column decoder 4.

The CDS 6 may be configured to receive the electric signals generated by the active pixel sensor array 1 and to perform a bolding and sampling operation on the received electric: signals. In addition, the CDS 6 may be configured to perform a double sampling operation using a specific noise level and a signal level of the electric signal. The CDS 6 may then output a difference level corresponding to a difference between the noise and signal levels, The ADC 7 may be configured to convert an analog signal, which includes information on the difference level outputted from the CDS 6, to a digital signal and to output the converted digital signal.

The I/O buffer 8 may be configured to latch the digital signals and then to sequentially output the latched digital signals to an image signal processing unit, based un the result decoded by the column decoder 4.

Figure 2:
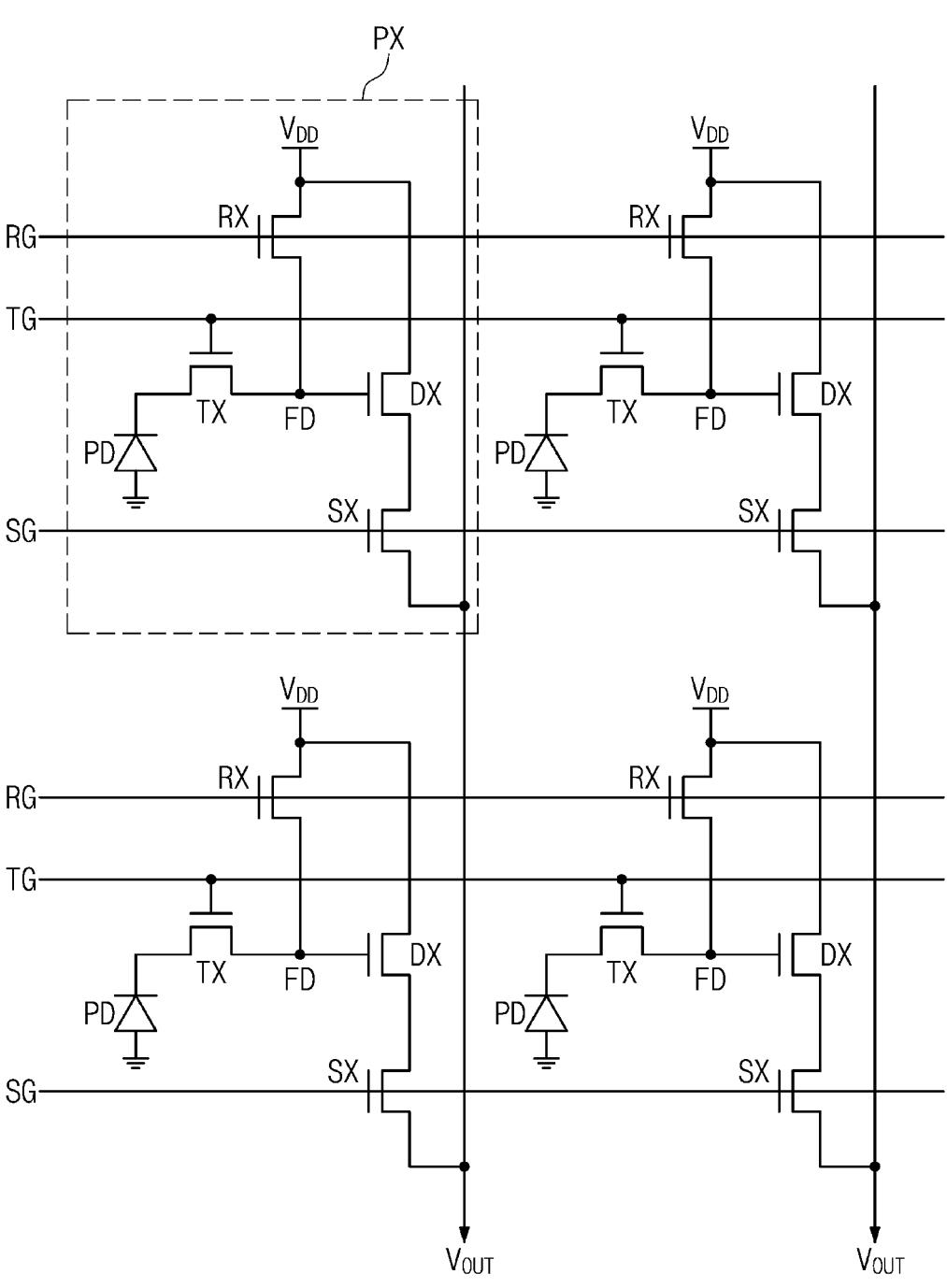
FIG. 2 is a circuit diagram illustrating an active pixel sensor array of an image sensor according to an exemplary embodiment of the present inventive concept.

FIG. 2 is a circuit diagram illustrating an active pixel sensor array of an image sensor according to an exemplary embodiment of the present inventive concept.

Referring to FIGS. 1 and 2, the active pixel sensor array 1 may include a plurality of pixels PX, which are arranged in a matrix shape, Each of the pixels PX may include a transfer transistor TX and logic transistors RX, SX, and DX. The logic transistors may include a reset transistor RX, a selection transistor SX, and a driving transistor DX. The transfer transistor TX, the reset transistor RX, and the selection transistor SX may include a transfer gate TG, a reset gate RG, and a selection gate SG, respectively. Each of the pixels PX may holier include a photoelectric conversion device PD and a floating diffusion region FD.

The photoelectric conversion device PD may be configured to generate and hold photocharges whose amount is in proportion to an mount of light incident from the outside. The photoelectric conversion device PD may be a photodiode including a p-type impurity region and an n-type purity region. The transfer transistor. TX may be configured to transfer electric charges, which are generated in the photoelectric conversion device PD, to the floating diffusion region FD. The floating diffusion region FD may be configured to receive the charges, which are generated in the photoelectric conversion device PD, and to cumulatively store them therein, The driving transistor DX may be controlled by an amount of the photocharges, which are stored in the floating diffusion region FD. For example, a gate electrode the driving transistor DX may be connected to the floating diffusion region FD.

The reset transistor RX may be configured to periodically discharge the electric charges stored in the floating diffusion region PD. A drain electrode of the reset transistor RX may be connected to the floating diffusion region ED and a source electrode of the reset transistor RX may be connected to a power voltage VDD. If the reset transistor RX is turned on, the power voltage VDD, which is connected to the source electrode of the reset transistor RX, may be applied to the floating diffusion region FD. Thus, the reset transistor RX may be turned on, and in this case, the electric charges stored in the floating diffusion region FD may be discharged; for example, the floating diffusion region FD may be reset.

The driving transistor DX may be a source follower buffer amplifier. The driving transistor DX may be configured to amplify a variation in electric potential of the floating diffusion region FD and to output the amplified signal to an output line Vout.

The selection transistor SX may be used to select a row of the pixels P to be read out during a read. operation. If the selection transistor SX is turned on, the power voltage VDD may be applied to a drain electrode of the driving transistor DX.

FIG. 2 illustrates the unit pixel PX including one the photoelectric conversion device PD and tour transistors TX, RX, DX, and SX, but the present inventive concept is not limited to this structure of the image sensor. For example, at least one of the reset transistor RX, the driving transistor DX, and/or the selection transistor SX may be shared by adjacent pixels of the pixels PX. In this case, an integration density of the image sensor may be increased.

Figure 3:
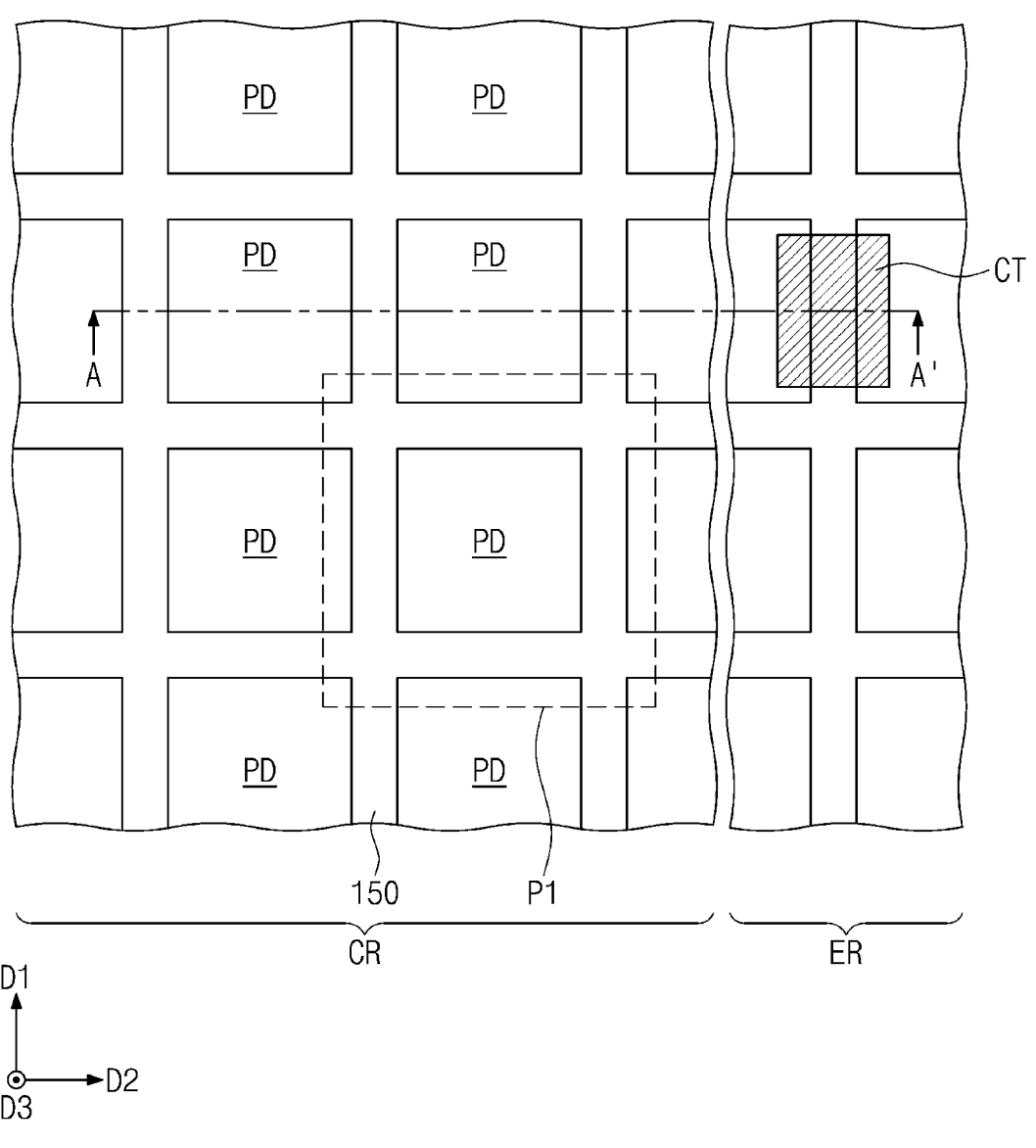
FIG. 3 is a plan view illustrating an image sensor according to an exemplary embodiment of the present inventive concept.
Figure 4A:
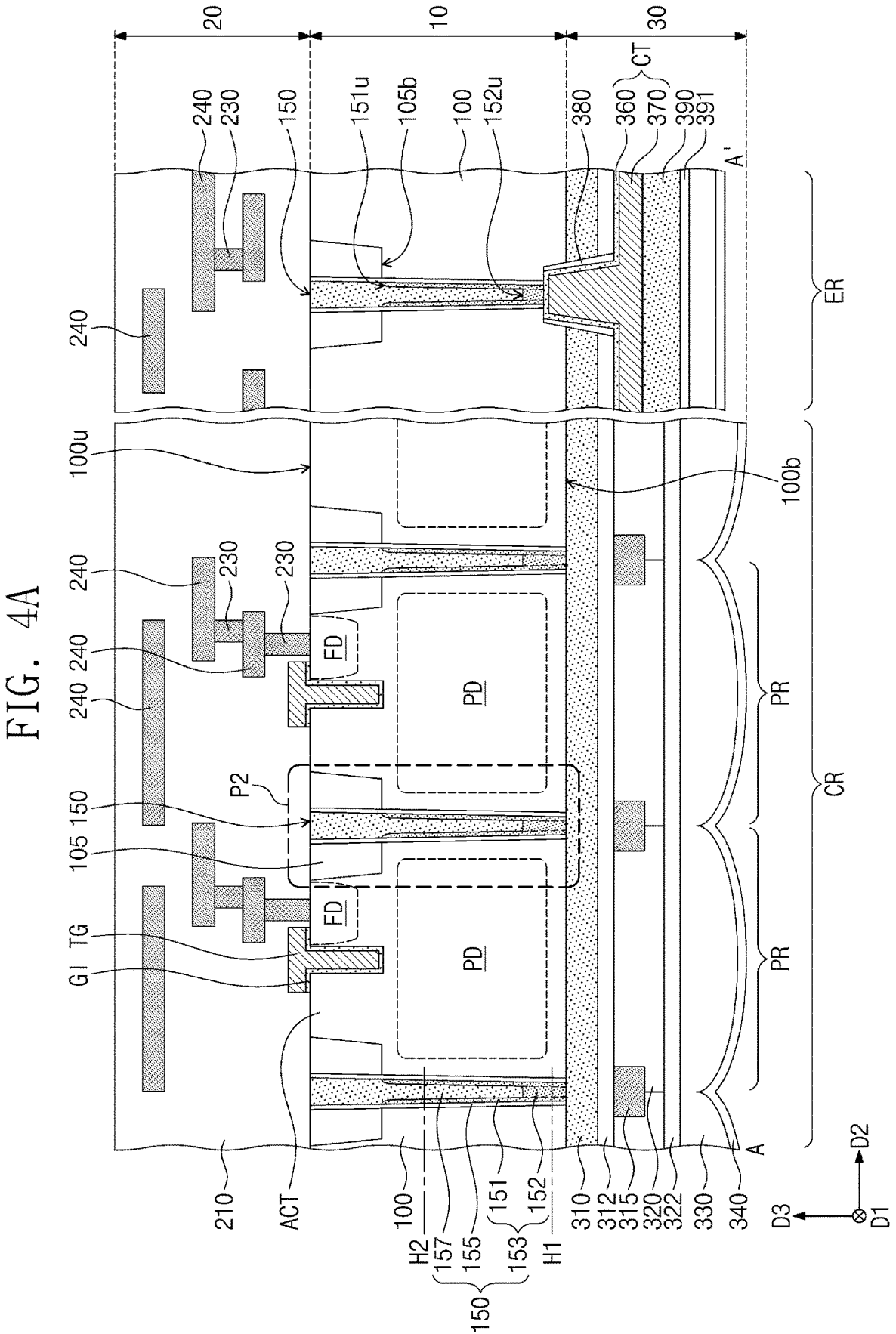
Figure 4B:
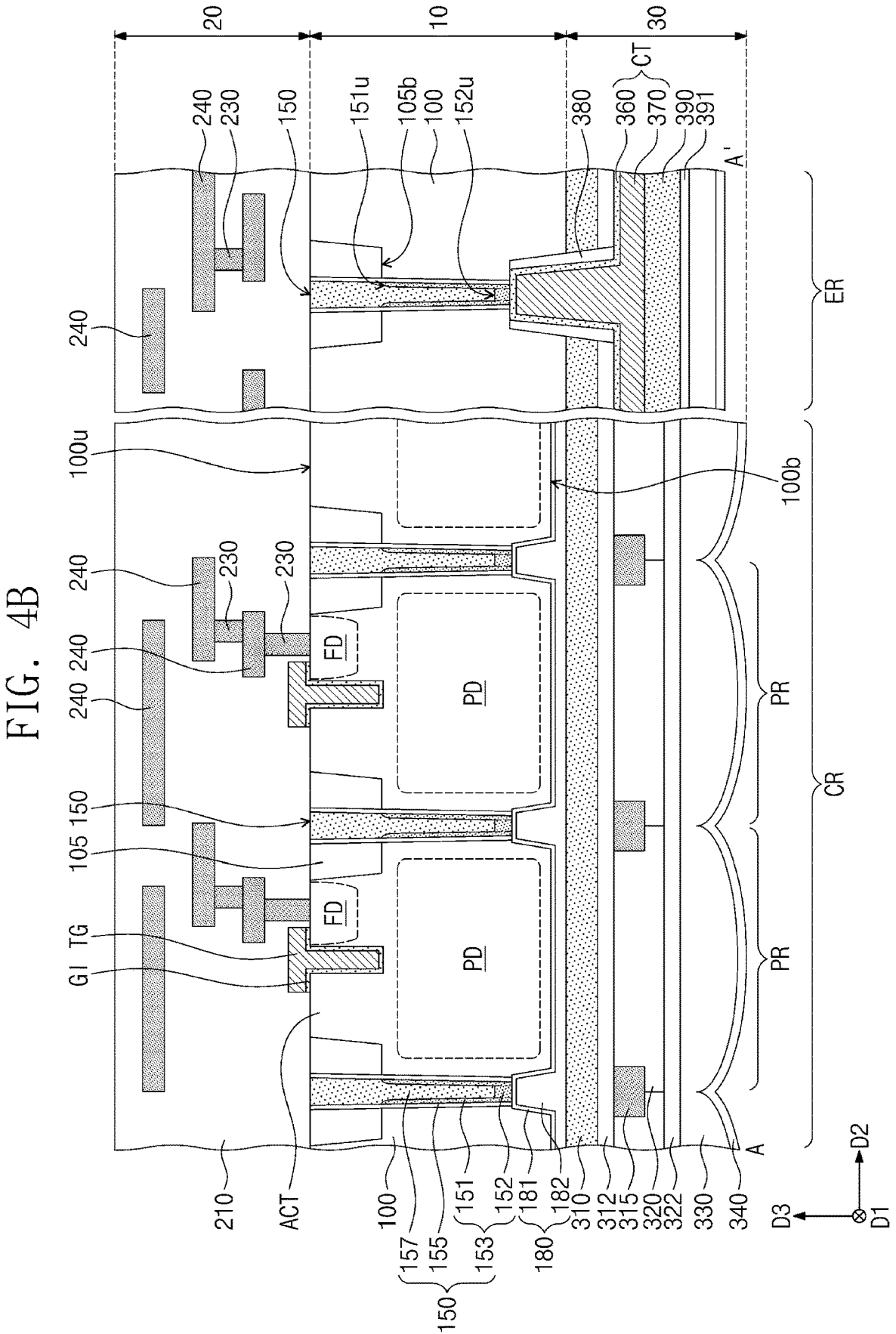

FIG. 3 is a plan view illustrating an image sensor according to an exemplary embodiment of the present inventive concept. FIGS. 4A and 4B are sectional views, each of which is taken along a line A-A' of FIG. 3 to illustrate an image sensor according to an exemplary embodiment of the present inventive concept.

Referring to FIGS. 3 and 4A, an image sensor may include a photoelectric conversion layer 10, an interconnection layer 20, aid an optically-transparent layer 30. The photoelectric conversion layer 10 may be disposed between the interconnection layer 20 and the optically-transparent layer 30.

The photoelectric conversion layer 10 may include a substrate 100, and in an exemplary embodiment of the present inventive concept, the substrate 100 may include a center region CR and an edge region ER enclosing the center region CR. The center region CR of the substrate 100 may include a plurality of pixel regions PR. The substrate 100 may be, for example, a semiconductor substrate (e.g., a silicon wafer, a germanium wafer, a silicon-germanium wafer, a Il-VI compound semiconductor water, or a III-V compound semiconductor wafer) or a silicon-on-insulator (SOI) wafer. The substrate 100 may have a first surface 100$u$ and a second surface 100$b$, which are opposite to each other. The pixel regions PR may be two-dimensionally arranged in a first direction D1 and a second direction D2 that are parallel to the first surface 100$u$ of the substrate 100. The first and second directions D1 and D2 may be non-parallel (e.g., orthogonal) to each other.

The photoelectric conversion layer 10 may include a deep device isolation pattern 150, which is provided between the pixel regions PR and penetrates the substrate 100. The pixel regions PR may be provided between the deep device isolation pattern 150. The deep device isolation pattern 150 may penetrate the substrate 100 in a third direction D3, which is substantially perpendicular to the first surface 100$u$, and may be extended from the first surface 100$u$ toward the second surface 100$b$. A top surface of the deep device isolation pattern 150 may be exposed by the first surface 100$u$ of the substrate 100 and may be substantially coplanar with the first surface 100$u$. A bottom surface of the deep device isolation pattern 150 may be exposed by second surface bob of the substrate 100 and may be substantially coplanar with the second surface 100$b$. The deep device isolation pattern 150 may prevent a cross-talk issue from occurring between the pixel regions PR, which are adjacent to each other.

The deep device isolation pattern 150 may include a semiconductor pattern 153, sidewall insulating patterns 155, and a gapfill insulating pattern 157.

The semiconductor pattern 153 may be extended from the second surface 100*b* toward the first surface 100*u* of the substrate 100, and a bottom surface of the semiconductor pattern 153 near the second surface 100*b* may be exposed to the outside of the substrate 100. The gapfill insulating pattern 157 may be disposed on the semiconductor pattern 153 and may be extended from the first surface 100*u* toward the second surface 100*b* of the substrate 100. The gapfill insulating pattern 157 may vertically overlap a portion of the semiconductor pattern 153 vertically (e.g., in the third direction D3). A top surface of the gapfill insulating pattern 157 near the first surface 100*u* of the substrate 100 may be exposed to the outside of the substrate 100. The sidewall insulating, patterns 155 may be interposed between the semiconductor pattern 153 and the substrate 100 and interposed between the gapfill insulating pattern 157 and the substrate 100. Each of the sidewall insulating patterns 155 may be provided to penetrate the substrate 100 in the third direction D3 and to enclose the pixel region PR.

The semiconductor pattern 153 may include sidewall portions 151, which are respectively provided to be adjacent to the sidewall insulating patterns 155, and a filling portion 152, which is provided between the sidewall portions 151. The sidewall portions 151 may be disposed on the sidewall insulating patterns 155 and may be extended from the second surface 100*b* toward the first surface 100*u* of the substrate 100, on the sidewall insulating patterns 155. When viewed in a plan view, each of the sidewall portions 151 may have a shape enclosing the pixel region PR. The filling portion 152 may be disposed adjacent to the second surface 100*b* of the substrate 100. A bottom surface of the filling portion 152 near the second surface 100*b* might not be veiled by the substrate 100. When viewed in a plan view, the filling portion 152 may be a mesh-shaped structure defined by line-shaped portions, which are extended in the first or second direction D1 or D2 to cross each other.

Bottom surfaces of the sidewall portions 151 and the bottom surface of the filling portion 152, which are near the second surface 100*b* of the substrate 100, may be substantially coplanar with each other and might not be covered by the substrate 100, Top surfaces 151*u* of the sidewall portions 151 may be located at a height higher than a top surface 152*u* of the filling portion 152.

Each of the sidewall and filling portions 151 and 152 of the semiconductor pattern 153 may be formed of or include a semiconductor material that is doped to have a conductivity type of p- or n-type. In an exemplary embodiment of the present inventive concept, each of the sidewall and filling portions 151 and 152 may be formed of or include boron-doped poly silicon.

The tilling portion 152 may be disposed on the sidewall portions 151 and may be provided between adjacent ones of the side all portions 151 to electrically connect the adjacent ones of the sidewall portions 151 to each other. As an example, the sidewall portions 151 and the filling portion 152 may be in contact with each other, with an interface therebetween. As another example, the sidewall portions 151 and the filling portion 152 may be in contact with each other, without any interface therebetween.

Each of the sidewall insulating patterns 155 may be interposed between each of the sidewall portions 151 and the substrate 100 and may be extended into a region between the gapfill insulating pattern 157 and the substrate 100. Each of the sidewall insulating patterns 155 may be disposed on a side surface of the gapfill insulating pattern 157. For example, each of the sidewall insulating patterns 155 may contact the side surface of the gapfill insulating pattern 157. The sidewall insulating patterns 155 may be formed of or include silicon oxide. In an exemplary embodiment of the present inventive concept, the sidewall insulating patterns 155 may be a single layer including silicon oxide. As another example, the sidewall insulating patterns 155 may be a multiple layer including silicon oxide.

The gapfill insulating pattern 157 may be disposed the filling portion 152 of the semiconductor pattern 153 and may be interposed between the sidewall portions 151 of the semiconductor pattern 153. The gapfill insulating pattern 157 may be interposed between the sidewall insulating patterns 155. In an exemplary embodiment of the present inventive concept, the gapfill insulating pattern 157 may be formed of or include at least one of silicon oxide, silicon nitride and/or silicon oxynitride.

The photoelectric conversion region PD may be disposed in each of the pixel regions PR. Each of the photoelectric conversion region PD may be spaced apart from one another, in the first and second directions D1 and D1. The substrate 100 may have a first conductivity type, and the photoelectric conversion region PD may be an impurity-doped region having a second conductivity type different from the first conductivity type. In an exemplary embodiment of the present inventive concept, the first conductivity type and the second conductivity type array be a p-type and an n-type, respectively. In this case, the impurity of the second conductivity type may include n-type impurities (e.g., phosphorus, arsenic, bismuth, and/or antimony). The photoelectric conversion region PD and the substrate 100 may form a p-n junction or a photodiode.

A shallow device isolation pattern 105 may be disposed near the first surface 100*u* of the substrate 100 and may be extended from the first surface 100*u* into the substrate 100. Each of the pixel regions PR may include an active pattern ACT, which is defined by the shallow device isolation pattern 105. A top surface of the shallow device isolation pattern 105 may be exposed at the first surface 100*u* of the substrate 100. The shallow device isolation pattern 105 may be formed of or include at least one of, for example, silicon oxide, silicon nitride, or silico oxynitride.

The deep device isolation pattern 150 may penetrate the shallow device isolation pattern 105 and may be extended into the substrate 100, At least a portion of the gapfill insulating pattern 157 of the deep device isolation pattern 150 may be disposed in the shallow device isolation pattern 105. As an example, the gapfill insulating pattern 157 may be provided to penetrate the shallow device isolation pattern 105 and to be in contact with the semiconductor pattern 153. The sidewall insulating patterns 155 of the deep device isolation pattern 150 ma be extended into a region between the shallow device isolation pattern 105 and the gapfill insula ting pattern 157.

In each of the pixel regions PR, the transfer gate electrode TG may be disposed on the first surface 100*u* of the substrate 100, and the floating diffusion region FD may be disposed in the substrate 100 near the first surface 10013 of the substrate 100. As an example, in each of the pixel regions PR, the transfer gate electrode TG may be disposed on the active pattern ACT and the floating diffusion region FD may be disposed in an upper portion of the active pattern ACT.

The transfer gate electrode TG and the floating diffusion region FD may constitute the transfer transistor TX of FIG. 2. A lower portion of the transfer gate electrode TG may be provided to partially penetrate the. active pattern ACT or to be extended into the substrate 100. An upper portion of the transfer gate electrode TCI may protrude above a top surface of the active pattern ACT (e.g., the first surface 100*u* of the substrate 100). The floating diffusion region FD may be disposed in a portion of the active pattern ACT located at a side of the transfer gate electrode TG. The floating, diffusion region FD may be doped to have the second conductivity type (e,g., an n-type) that is different from the first conductivity type of the substrate 100. A gate dielectric layer GI may be interposed between the transfer gate electrode TG and the active pattern ACT. For example, a gate dielectric layer GI ma be interposed between the transfer gate electrode TG and the first surface 100*u* of the substrate 100.

The interconnection layer 20 may be disposed on the first surface 100*u* of the substrate 100. The interconnection layer 20 may include an interlayer insulating layer 210 stacked on the first surface 100*u* of the substrate 100. The interlayer insulating layer 210 may cover the first surface 100*u*, the top surface of the deep device isolation pattern 150, and the top surface of the shallow device isolation pattern 105. In addition, the interlayer insulating layer 210 may be disposed on the first surface 100*u* of the substrate 100 to cover transistors constituting the pixels PX of FIG. 2.

The interconnection layer 20 may further include contact plugs 230 and conductive lines 240. The contact plugs 230 may be electrically connected to the transistors, and the conductive lines 240 may be electrically connected to the contact plugs 230. The interlayer insulating layer 210 may be formed of or include at least one of insulating materials, and the contact plugs 230 and the conductive lines 240 may be formed of or include at least one of conductive materials.

The optically-transparent layer 30 may be disposed on the second surface 100*b* of the substrate 100. The optically-transparent layer 30 may include a color filter array 320 and a micro lens array 330 disposed on the second surface 100*b* of the substrate 100. The color filter array 320 may be disposed between the second surface 100*b* of the substrate 100 and the micro lens array 330. The optically-transparent layer 30 may be configured to condense and filter an incident light from the outside and thereby to provide the light into the photoelectric conversion layer 10.

The color filter array 320 may include a plurality of color filters 320 which are disposed on the pixel regions PR, respectively. In an exemplary embodiment of the present inventive concept, four pixel regions, which are arranged in a 2×2 shape, may be disposed to display the same color. The micro lens array 330 may include a plurality of micro lenses 330 disposed on the color filters 320. The micro lens 330 may be overlapped with the photoelectric conversion regions PD (e.g., in the third direction D3), respectively. A passivation layer 340 may be provided to cover the micro lens 330. The micro lens array 330 and the passivation layer 340 may be extended parallel to the second surface 100*b* on the edge region ER.

An anti-reflection layer 310 may be interposed between the second surface 100*b* and the color filter array 320. The anti-reflection layer 310 may be configured to prevent light, which is incident into the second surface 100*b* of the substrate 100, from being reflected, and thereby to allow the light to effectively reach the photoelectric conversion region PD. A first insulating layer 312 may be interposed between the anti-reflection layer 310 and the color filter array 320, and a second insulating layer 322 may be interposed between the color filter array 320 and the micro lens array 330. A grid 315 may be interposed between the first insulating layer 312 and the color filter array 320. The grid 315 may be disposed to be overlapped with the deep device isolation pattern 150 (e.g., in the third direction D3). The grid 315 may be configured to guide light, which is incident through the second surface 100*b*, and thereby to allow the light to be incident into the photoelectric conversion region PD. For example, the grid 315 may be firmed of or include at least one of metallic materials. The color filter array 320 may be extended into a region between adjacent ones of the grids 315 and may be in contact with the first insulating layer 312.

A contact pattern CT may be disposed on the edge region ER and adjacent to the second surface 100*b*. The contact pattern CT may include a portion, which is extended into the substrate 100 and penetrates the anti-reflection layer 310 and the color filter array 320. The contact pattern CT is in contact with the bottom surface of the semiconductor pattern 153. The contact pattern CT may include a metal patient 370, which is provided on the first insulating layer 312 and is partially extended into the substrate 100, and a barrier pattern 360, which is provided to enclose the metal pattern 370. For example, the metal pattern 370 may penetrate the first insulating layer 312.

A contact insulating layer 380 may be provided to enclose the contact pattern CT. The contact pattern CT may be extended to other region and may be electrically connected to a through silicon via (TSV) or back vias stack (BVS). Thus, a negative bias voltage may be applied to the semiconductor pattern 153 through the contact pattern CT, and as a result, it may be possible to prevent of suppress a white spot issue or a dark current issue.

A bulk color filter 390 and a first protection layer 391 may be sequentially provided on the edge region ER and may cover the contact pattern CT. The bulk color filter 390 may be interposed between the contact pattern CT and the micro lens array 330, and the first protection layer 391 may be interposed between the bulk color filter 390 and the micro lens array 330.

Referring to FIGS. 3 and 4B, the photoelectric conversion layer 10 may further include a back-side device isolation pattern 80, which is disposed adjacent to the second surface 100*b* of the substrate 100. The back-side device isolation pattern 180 may be provided on the second surface 1001 and may be extended into the substrate 100. The back-side device isolation pattern 180 may be overlapped with the deep device isolation pattern 150 (e.g., in the third direction D3). For example, the back-side device isolation pattern 180 and the deep device isolation pattern 150 may be aligned with each other. For example, similar to the deep device isolation pattern 150, the back-side device isolation pattern 180 may be in contact with the semiconductor pattern 153 of the deep device isolation pattern 150.

The back-side device isolation pattern 180 may include a surface dielectric layer 181 and a gap-fill dielectric layer 182. The gap-fill dielectric layer 182 may be provided on the second surface 100*b* and may be extended into the substrate 100. The surface dielectric layer 181 may be interposed between the gap-fill dielectric layer 182 and the substrate 100. For example, the surface dielectric layer 181 and the gap-fill dielectric layer 182 may be formed of metal oxide or metal fluoride including at least one of hafnium (Hf), zirconium (Zr), aluminum (Al), tantalum (Ta), titanium (Ti), yttrium (Y) and/or lanthanum (La).

FIGS. 5A, 58, 6A to 6D, 7A and 7B are enlarged sectional views illustrating a portion 'P2' of FIG. 4A. Hereinafter, exemplary embodiments of the present inventive concept will be described in more detail with reference to FIGS. 5A, 5B, 6A to 6D, 7A, and 7B. For concise description, a previously described element may be identified by the same reference number without repeating an overlapping or redundant description thereof.

Figure 5A:
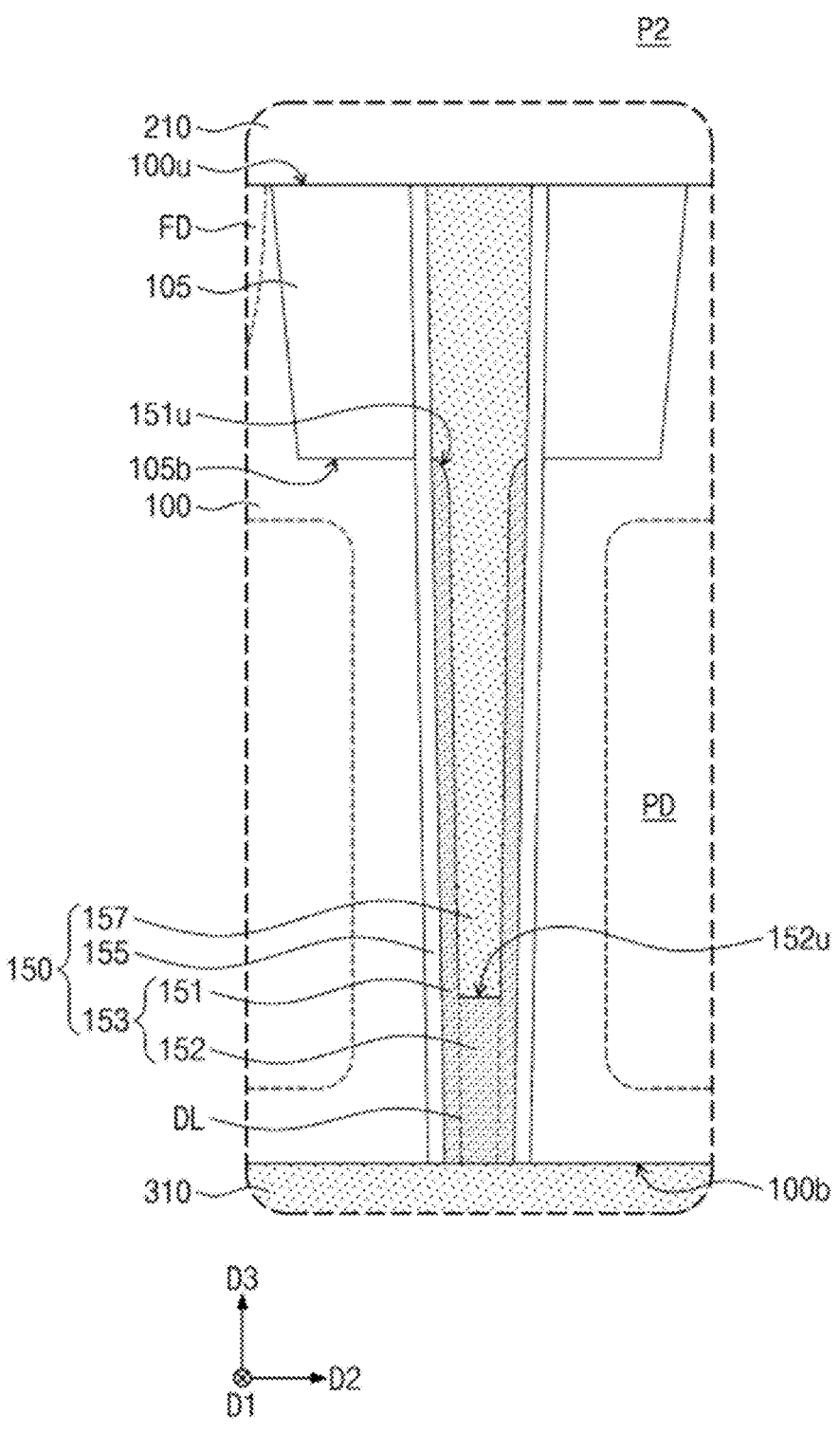
Figure 5B:
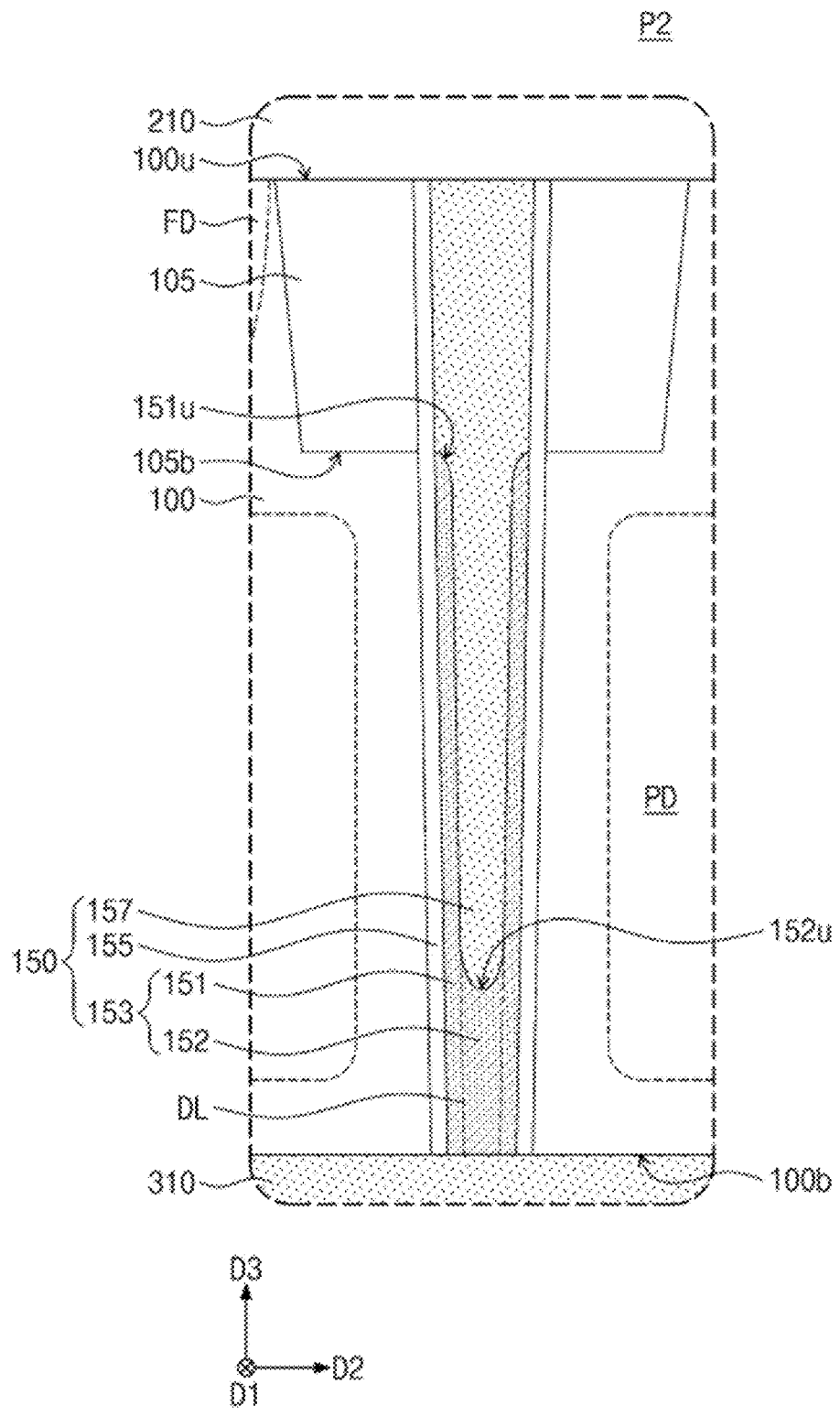

Referring to FIGS. 5A and 5B, the top surfaces 151*u* of the sidewall portions 151 of the semiconductor pattern 153 may be located at a height higher than the top surface 152*u* of the filling portion 152 of the semiconductor pattern 153. The top surface 152*u* of the filling portion 152 may have various shapes. As an example, the top surface 152*u* of the filling portion 152 may be parallel to the first surface 100*u* of the substrate 100 and may have a flat shape, as shown in FIG. 5A. As another example, the top surface 152*u* of the filling portion 152 may have a concave shape, as shown in FIG. 5B. In other words, the top surface 152*u* of the filling portion 152 may have a center portion, which is concavely recessed toward the second surface 100*b* (e.g., toward an inner portion of the filling portion 152), and as a distance to the sidewall portions 151 decreases, a height of the top surface 152*u* of the filling portion 152 in the third direction D3 may increase. However, the present inventive concept is not limited to this example.

Referring to FIGS. 6A to 6D, the deep device isolation pattern 150 may further include an air gap AG. The air gap AG may be provided in the deep device isolation pattern 150 and may be interposed between the sidewall portions 151 of the semiconductor pattern 153.

Figure 6A:
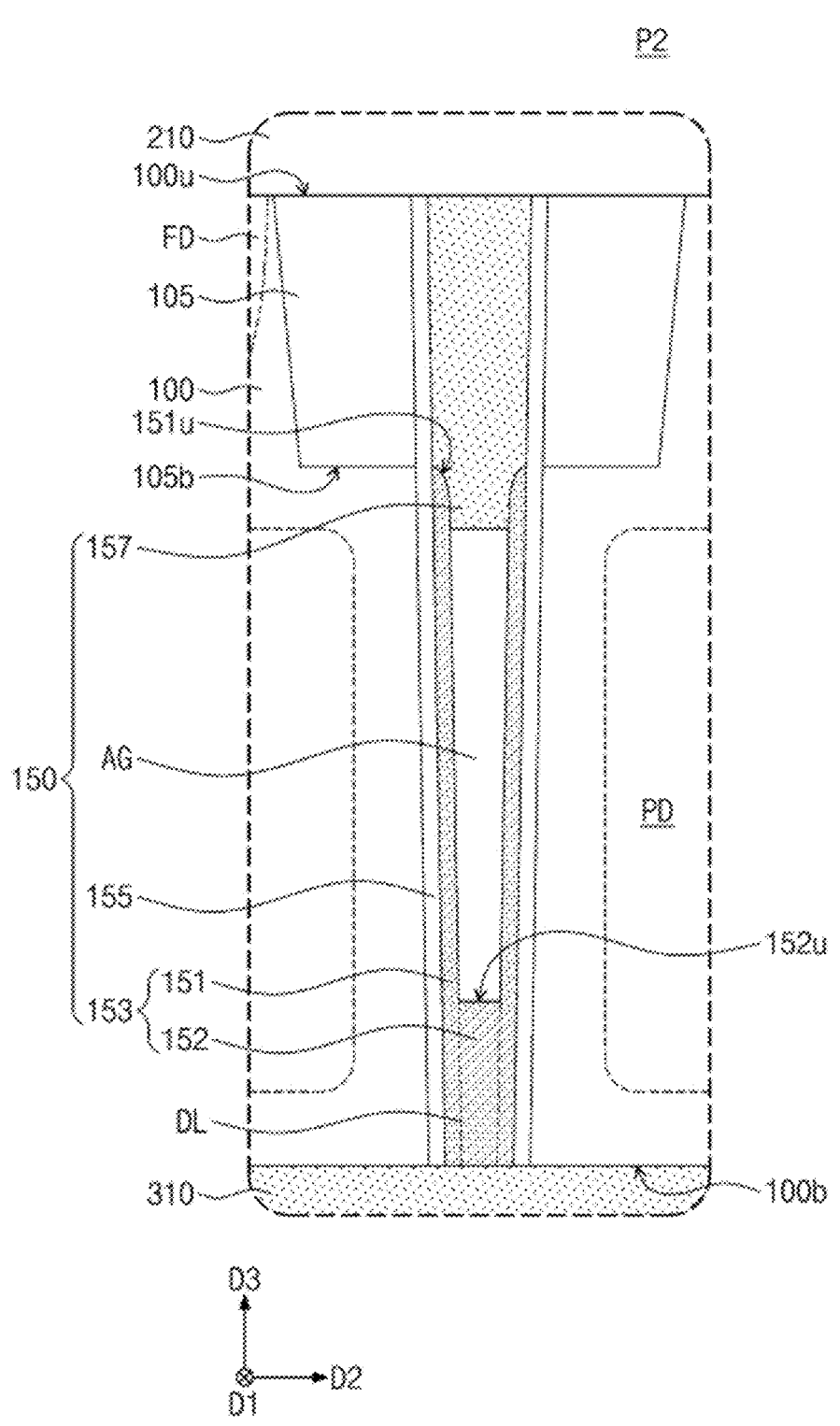
Figure 6B:
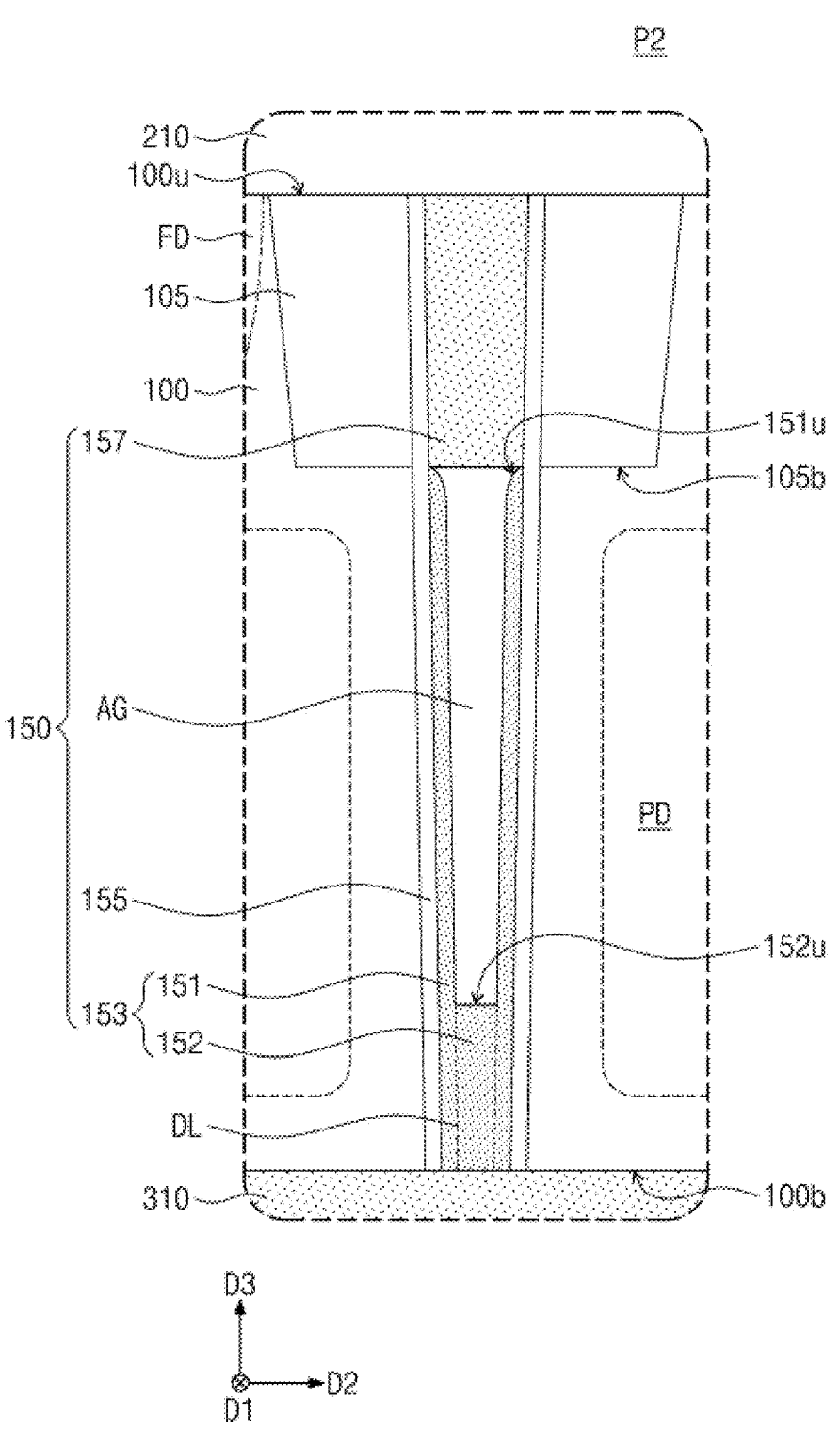
Figure 6C:
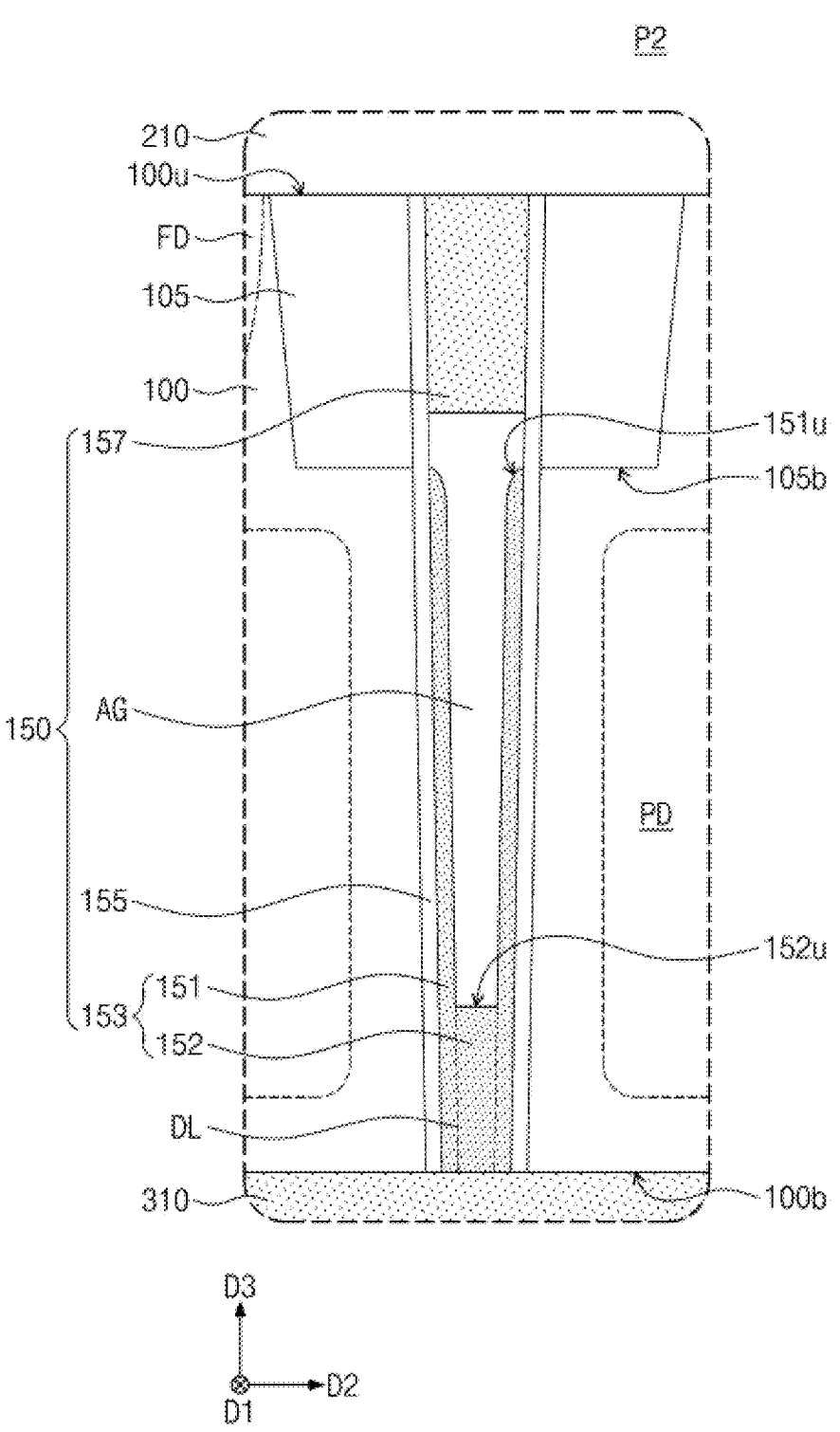

Referring to FIGS. 6A to 6C, the air gap AG may be interposed between the gapfill insulating pattern 157 and the semiconductor pattern 153. The gapfill insulating pattern 157 may be spaced apart from the filling portion 152 of the semiconductor pattern 153 by the air gap AG that may be disposed therebetween.

A bottom surface of the gapfill insulating pattern 157 may be exposed to the air gap AG. As an example, the bottom surface of the gapfill insulating pattern 157 may be located at a height lower than the top surfaces 151*u* of the sidewall portions 151 and may be exposed to the air gap AG, as shown in FIG. 6A. As another example, the bottom surface of the gapfill insulating pattern 157 may be located at substantially the same height as the top surfaces 151*u* of the sidewall portions 151 and may be exposed to the air gap AG, as shown in FIG. 6B. As other example, the bottom surface of the gapfill insulating pattern 157 may be located at a height higher than the top surfaces 151*u* of the sidewall portions 151 and may be exposed to the air gap AG, as show1 in FIG. 6C. The top surface 152*u* of the filling portion 152 and inner side surfaces of the sidewall portions 151 may be exposed to the air gap AG.

Figure 6D:
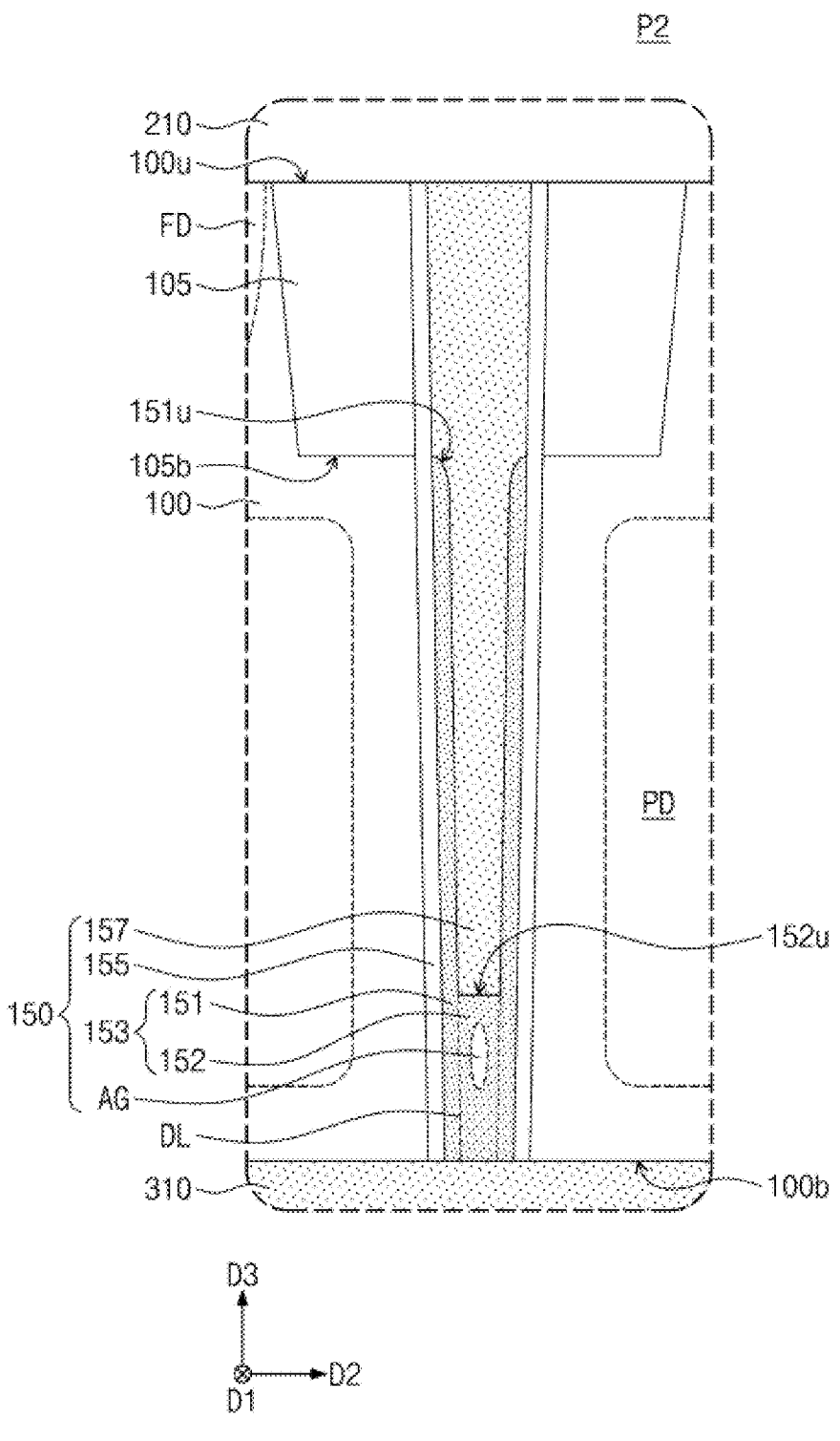

Referring to FIG. 6D, the air gap AG may be provided in the filling portion 152 of the semiconductor pattern 153. As an example, the air gap AG may be disposed in the filling portion 152 and may be enclosed by the filling portion 152. As another example, the air gap AG may be exposed at the top surface 152*u* or the bottom surface of the filling portion 152.

Figure 7A:
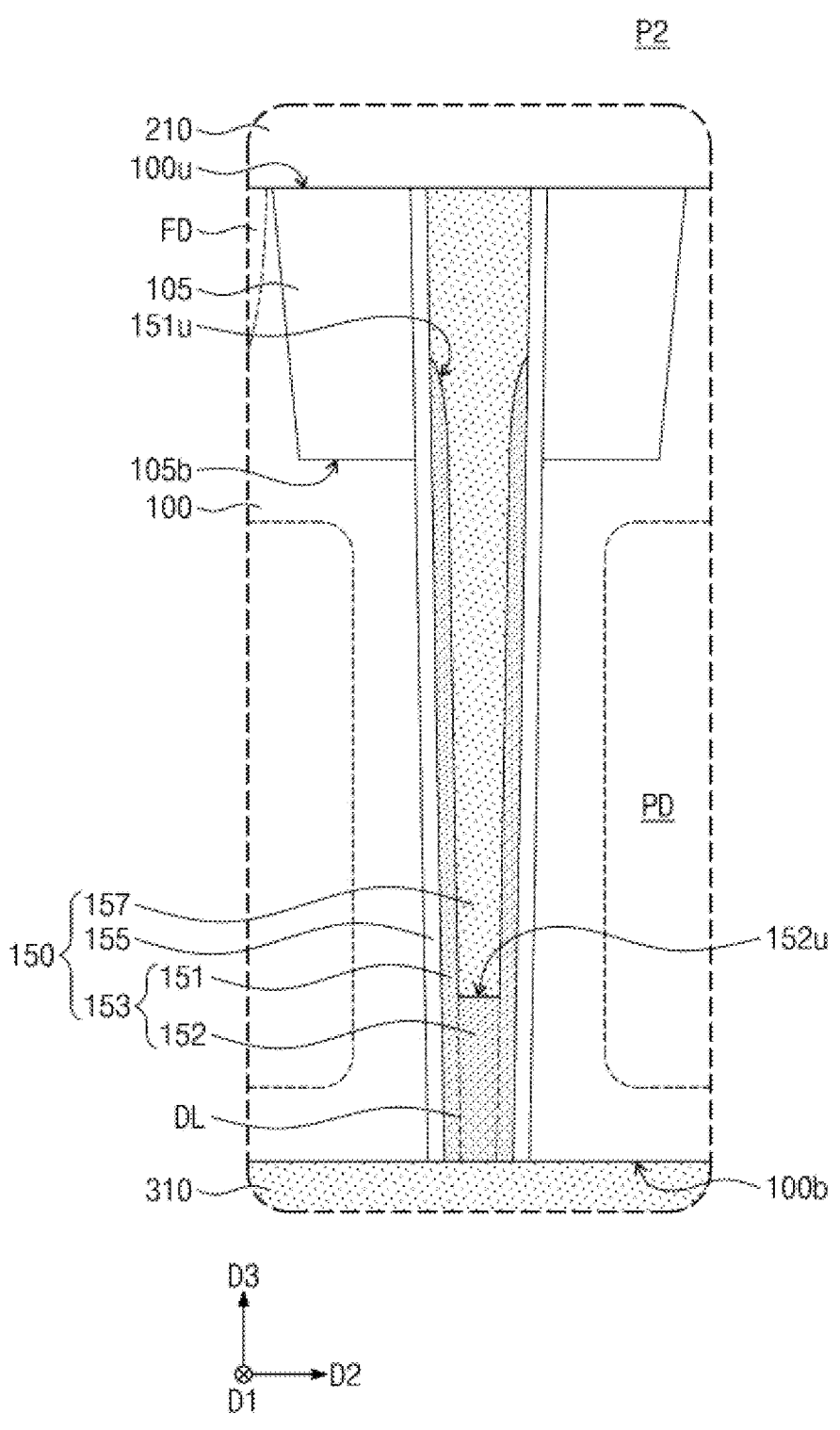
Figure 7B:
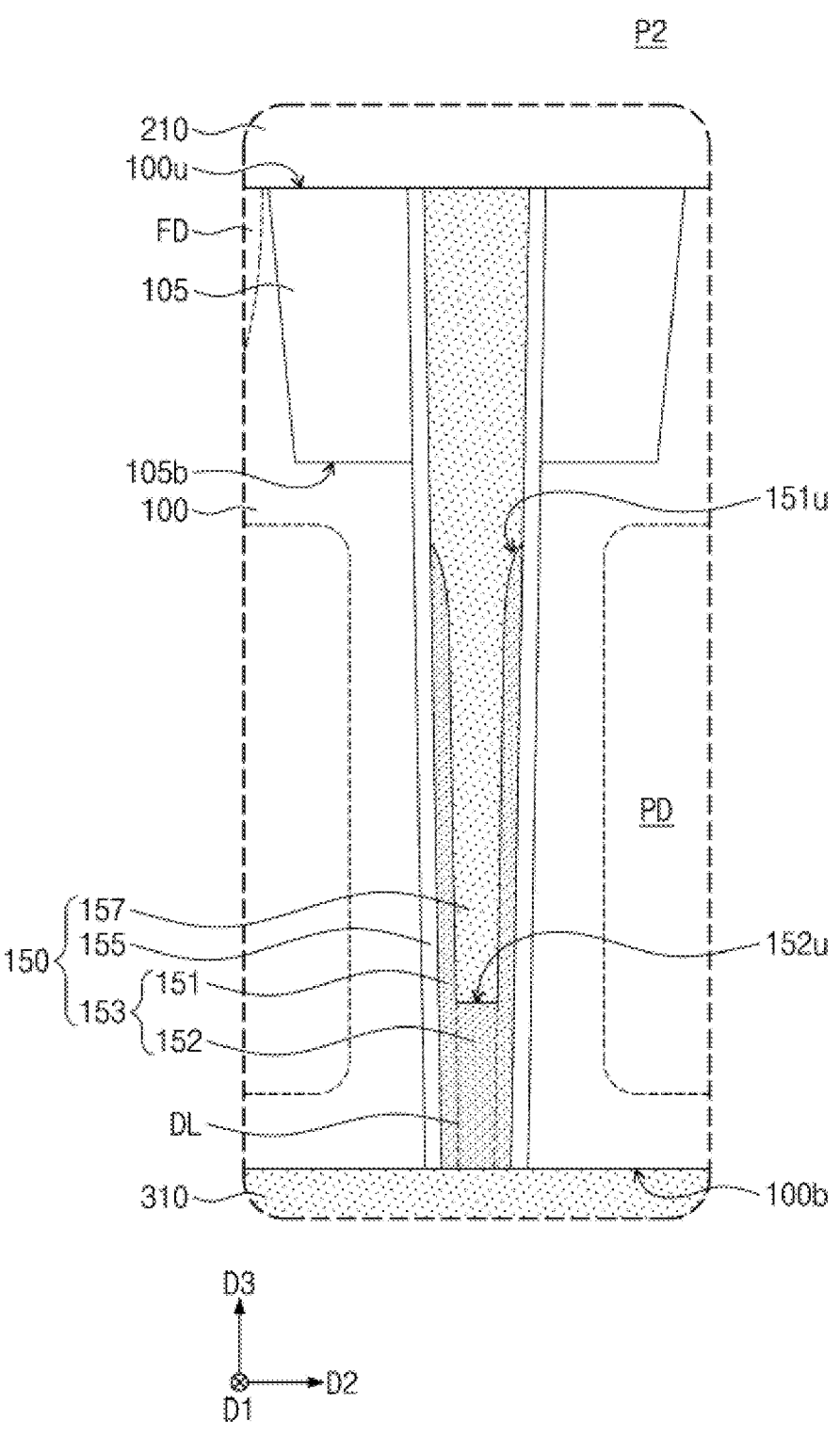

Referring to FIGS. 7A and 7B, the top surfaces 151*u* of the sidewall portions 151 of the semiconductor pattern 153 may be located at various heights. As an example, the top surfaces 151*u* of the sidewall portions 151 may be located at a height higher than a bottom surface 105*b* of the shallow device isolation pattern 105, as shown in FIG. 7A. As another example, the top surfaces 151*u* of the sidewall portions 151 may be located at a height lower than the bottom surface 105*b* of the shallow device isolation pattern 105, as shown in FIG. 7B. As other example, the top surfaces 151*u* of the sidewall portions 151 may be positioned at substantially the same height as the bottom surface 105*b* of the shallow device isolation pattern 105.

Figure 8A:
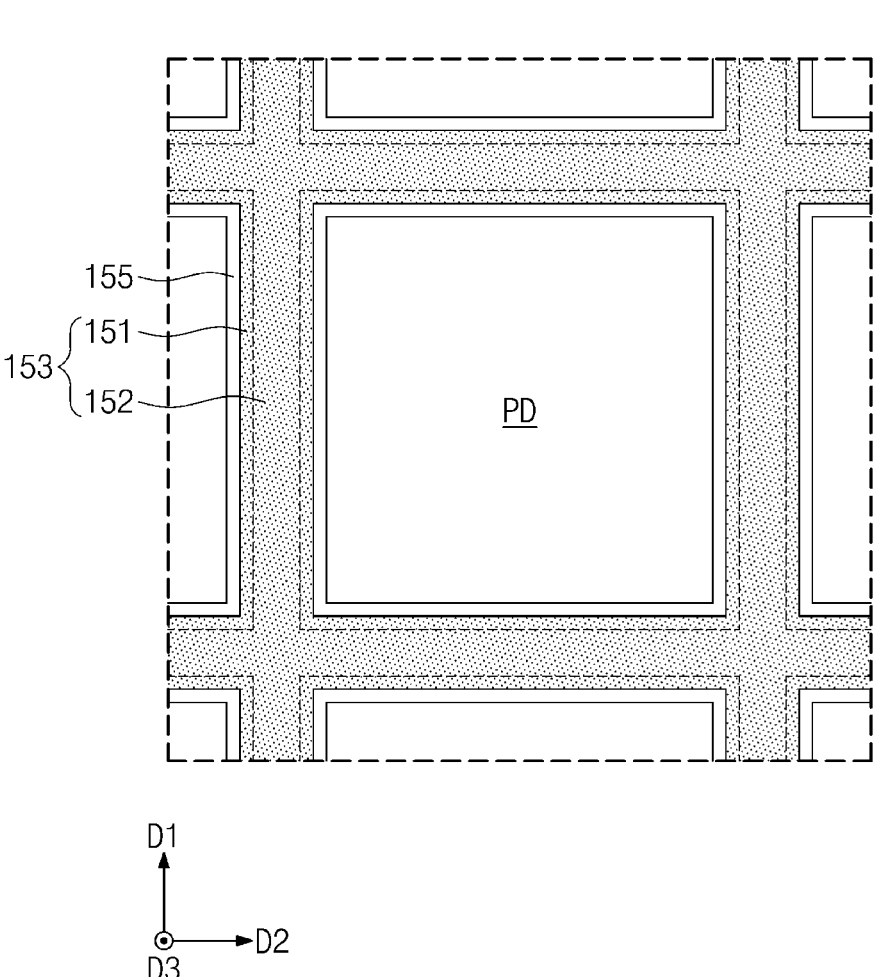
FIGS. 8A, 8B, and 9A, 9B and 9C are enlarged plan views illustrating a portion 'P1' of FIG. 3.
Figure 8B:
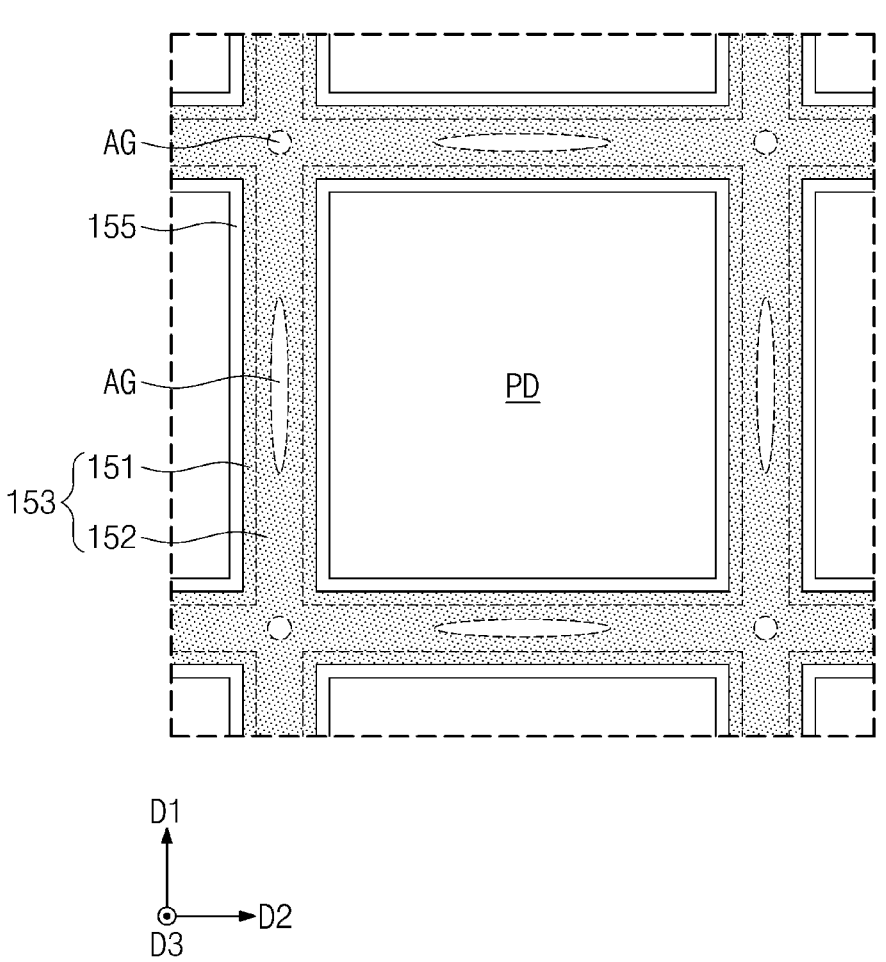

FIGS. 8A, 8B, and 9A to 9C are enlarged plan views illustrating a portion 'P1' of FIG. 3. FIGS. 8A and 8B are enlarged plan views of the portion 'P1' of FIG. 3 taken at a lower level H1 of FIG. 4A, and FIGS. 9A to 9C are enlarged plan views of the portion 'P1' of FIG. 3 taken at an upper level H2 of FIG. 4A. The lower level H1 may be located between the top and bottom surfaces of the filling portion 152 of the semiconductor pattern 153, and the upper level H2 may be located at a height that is higher than the top surface 152*u* of the filling portion 152 and lower than the top surface 151*u* of the sidewall portion 151.

Referring to FIGS. 8A and 8B, the photoelectric conversion regions PD may be spaced apart from each other in the first and second directions D1 and D2. The sidewall insulating patterns 155 and the semiconductor pattern 153 may enclose the photoelectric conversion region PD. The semiconductor pattern 153 may include the sidewall portions 151, each of which encloses a corresponding one of the sidewall insulating patterns 155, and the filling portion 152, which is interposed between the sidewall portions 151.

In the case where the deep device isolation pattern 150 does not include the air ap AG therein, the filling portion 152 having no empty space may be disposed between adjacent sidewall portions 151 of the sidewall portions 151, as shown in FIG. 8A.

In the case where, as described with reference to FIG. 6D, the air gap AG is provided in the filling portion 152, the air gap AG may be disposed between the photoelectric conversion regions PD, as shown in FIG. 8B. As an example, the air gap AG may be disposed between two photoelectric conversion regions PD, which are adjacent to each other. As another example, the air gap AG may be disposed between four photoelectric conversion regions PD, which are adjacent to each other.

Figure 9A:
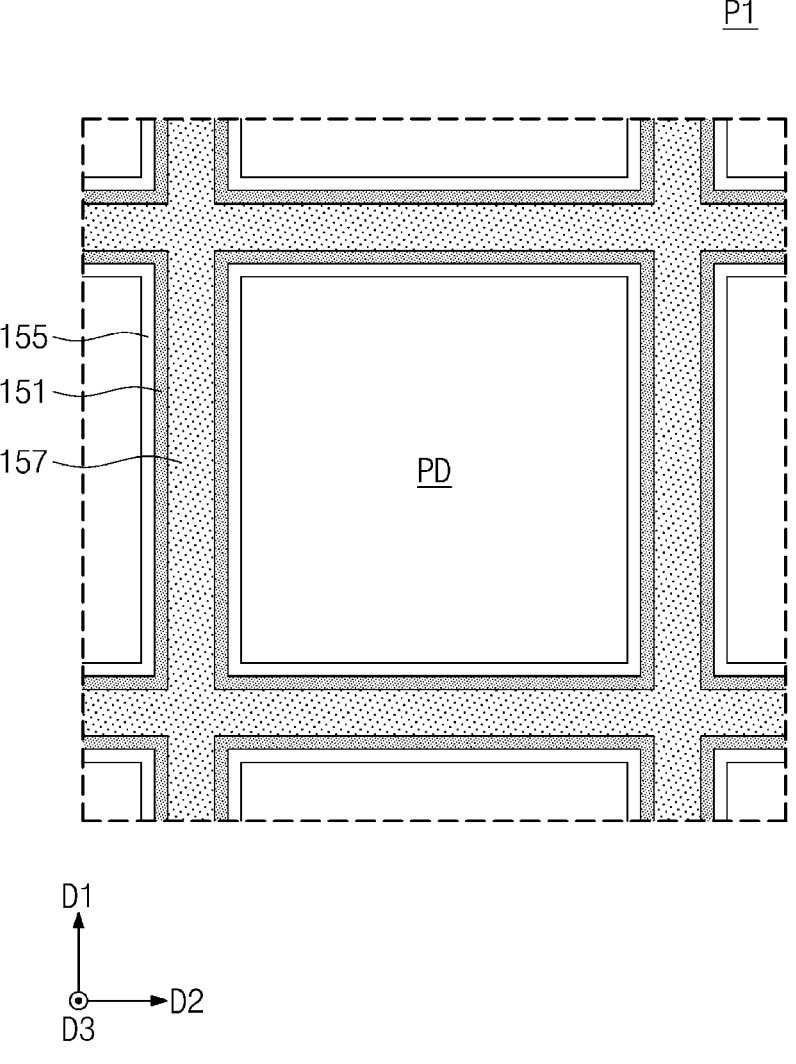
Figure 9B:
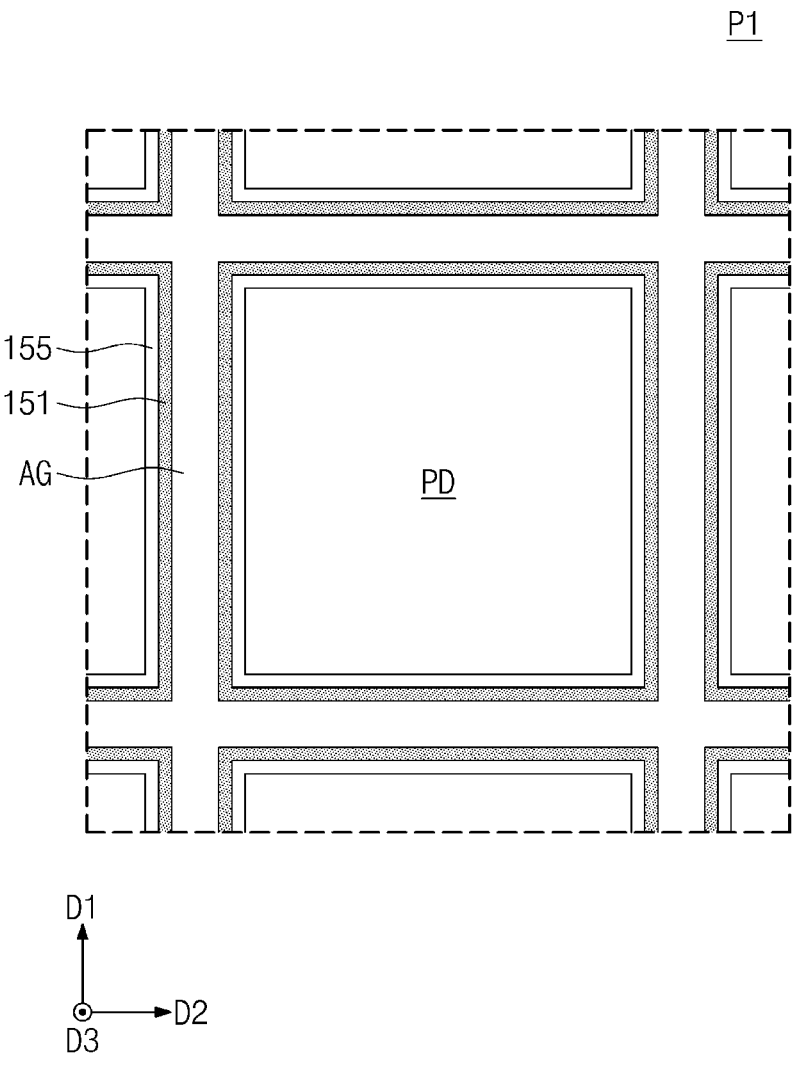
Figure 9C:
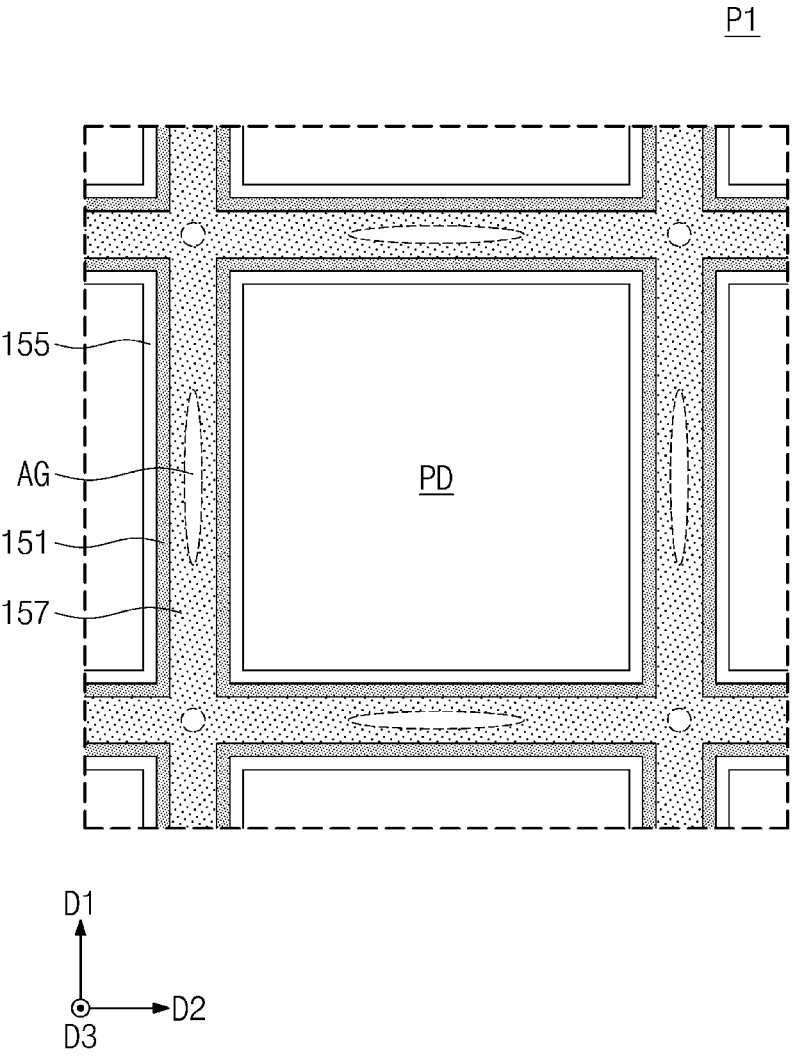

Referring to FIGS. 9A to 9C, the sidewall insulating patterns 155 and the sidewall portions 151 of the semiconductor pattern 153 may enclose the photoelectric conversion region PD. At least one of the gapfill insulating pattern 157 or the air gap AG may be disposed between adjacent ones of the sidewall portions 151. As an example, in the case where the deep device isolation pattern 150 does not have the air gap AG therein, the gapfill insulating pattern 157 that has no empty space may be disposed between the adjacent sidewall portions 151 of the sidewall portions 151, as shown in FIG. 9A. As another example, in the case where, as described with reference to FIGS. 6A to 6C, there is the air gap AG between the sidewall portions 151 of the semiconductor pattern 153 and between the semiconductor pattern 153 and the gapfill insulating pattern 157, a space between the adjacent sidewall portions 151 of the sidewall portions 151 may be an empty space, as shown in FIG. 9B. In other words, the air gap AG may be provided between the adjacent sidewall portions 151 of the sidewall portions 151. As other example, the gapfill insulating pattern 157 may be disposed between the adjacent sidewall portions 151 of the sidewall portions 151, and the air gap AG may be provided in the gapfill insulating pattern 157, as shown in FIG. 9C.

FIGS. 10A to 10F are sectional views, which are taken along the line A-A' of FIG. 3 to illustrate a method of fabricating an image sensor according to an exemplary embodiment of the present inventive concept. Hereinafter, a method of fabricating an image sensor will be described in more detail with reference to FIGS. 10A to 10F. For concise description, a previously described element may be identified by the same reference number without repeating an overlapping or redundant description thereof.

Figure 10A:
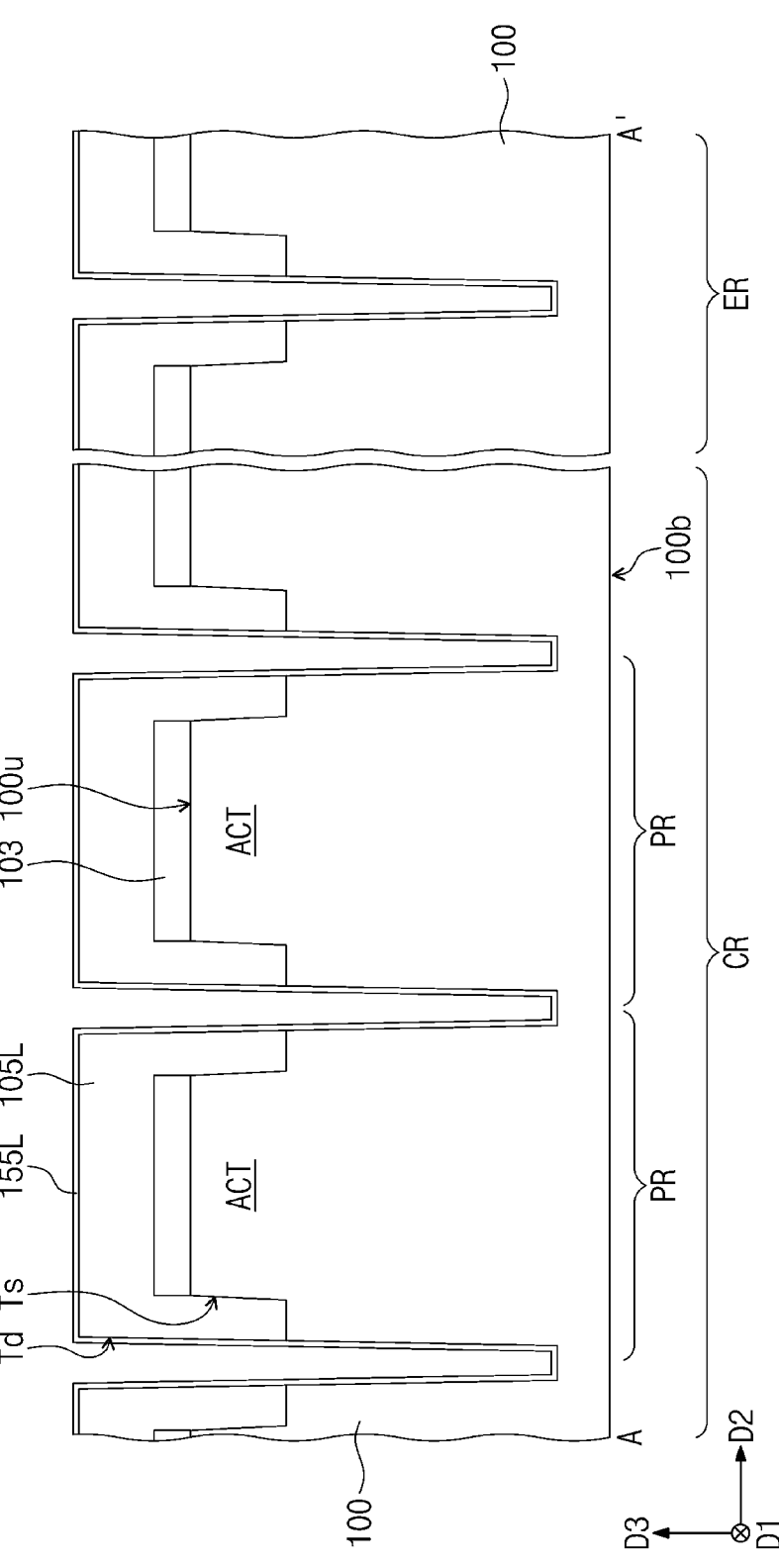
FIGS. 10A, 10B, 10C, 10D, 10E 10F, 11A, 11B 11C, and 12A, 12B and 12C are sectional views, which are taken along the line A-A' of FIG. 3 to illustrate a method of fabricating an image sensor according to an exemplary embodiment of the resent inventive concept.

Referring to FIG. 10A, the substrate 100 may be provided, and the substrate 100 may include the first and second surfaces 100*u* and 100*b* which are opposite to each other.

The substrate 100 may include the center region CR and the edge region ER enclosing the center region CR.

A shallow trench Ts may be formed in an upper portion of the substrate 100 near or adjacent to the first surface 100*u*. The formation of the shallow trench Ts may include forming a first mask pattern 103 on the first surface 100*u* and etching the substrate 100 using the first mask pattern 103 as an etch mask. The shallow trench Ts may be formed to form the active pattern ACT in the substrate 100.

A device isolation layer 105L may be formed on the first. surface 100*u* of the substrate 100. The device isolation layer 105L may be formed to cover the first mask pattern 103 and to fill the shallow trench Ts. The device isolation layer 105L may include at least one of, for example, a silicon oxide layer, a silicon nitride layer, and/or a silicon oxynitride layer.

A deep trench Td may be formed in the substrate 100 and may protrude into it substrate 100 from the first surface 100*u* of the substrate 100. The formation of the deep trench Td may include providing a second mask pattern on the device isolation layer 105L to define a region for the deep trench Td and etching the device isolation layer 105L and the substrate 100 using the second mask pattern as an etch mask. The deep trench Td may form the pixel regions PR in the substrate 100. The pixel regions PR may be formed in the center region CR of the substrate 100, and each of the pixel regions PR may include the active pattern ACT formed by the shallow trench Ts.

When viewed in a plan view, the deep trench Td may be formed to have line-shaped regions, which are extended in the first or second direction D1 or D2 parallel to the first surface 100*u* of the substrate 100 and cross each other. The first and second directions D1 and D2 may be non-parallel (e.g., orthogonal) to each other. The deep trench Td may be formed to enclose the pixel regions PR.

A sidewall insulating layer 155 may be formed to cover an inner surface of the deep trench Td and may be extended to cover a top surface of the device isolation layer 105L. The sidewall insulating layer 155L may conformally cover the inner surface of the deep trench Td and the top surface of the device isolation layer 105L.

Figure 10B:
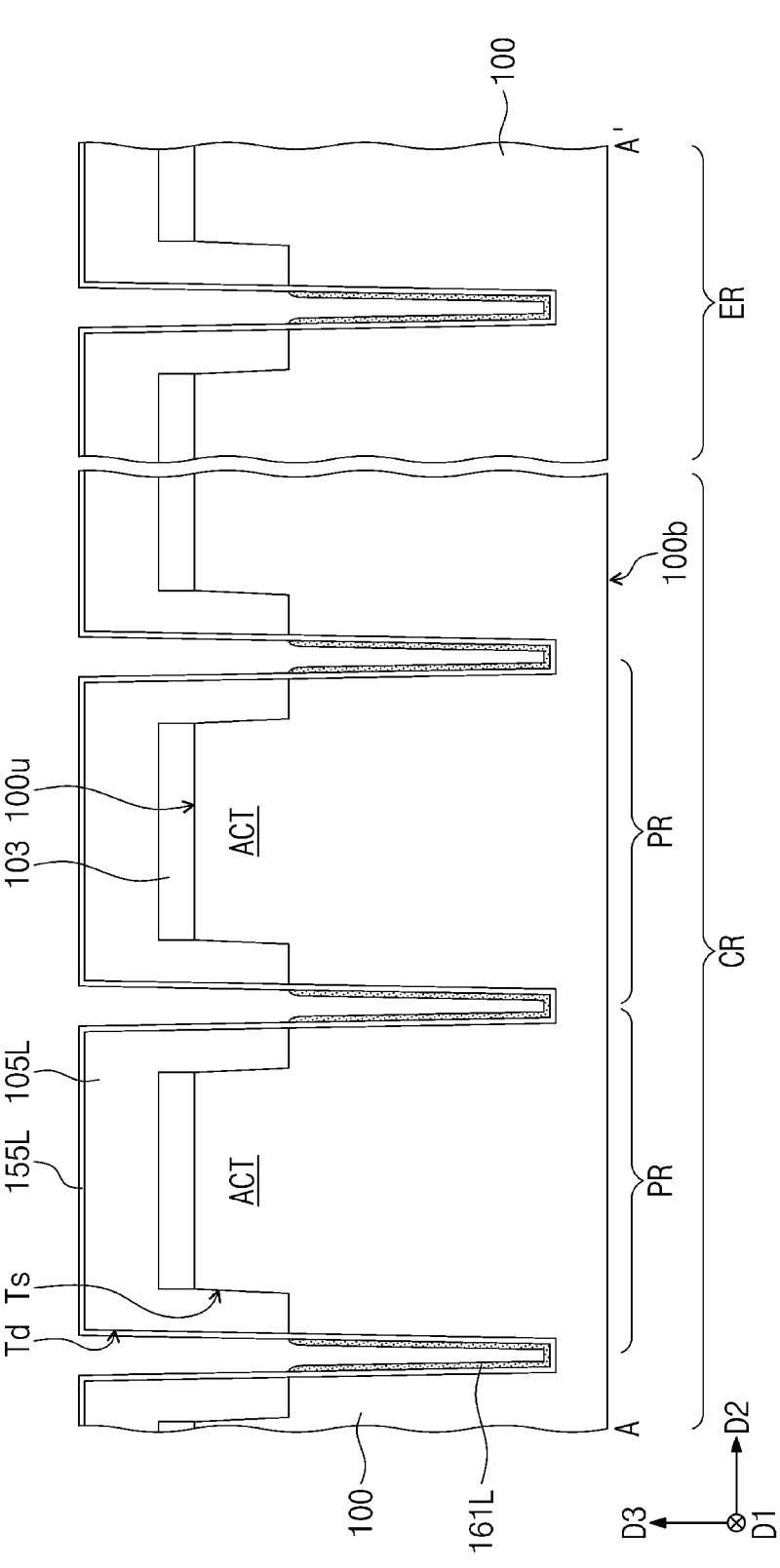

Referring to FIG. 10B, a first sub-semiconductor layer 161L may be formed to partially fill the deep trench Td and to cover at least a portion of the sidewall insulating layer 155L. For example, the formation of the first sub-semiconductor layer 161L may include forming a sub-layer to conformally cover the inner and top surfaces of the sidewall insulating layer 155L and removing an upper portion of the sub-layer to form the first sub-semiconductor layer 161L. The first sub-semiconductor layer 161L may conformally cover an inner surface of the sidewall insulating layer 155L, and the sidewall insulating layer 155L may be interposed between the inner surface of the deep trench Id the first sub-semiconductor layer 161L. The first sub-semiconductor layer 161L may be for led of or include a semiconductor material, which is doped to have a conductivity type of p- or n-type. As an example, the first sub-semiconductor layer 161L may be formed of or include boron-doped poly silicon.

The first sub-semiconductor layer 161L may be formed by a process (e.g. LPCVD or PECVD) of depositing a material including semiconductor and dopant materials or by a process (e.g., ion implantation, plasma doping, or gas phase doping process) of depositing a semiconductor material and injecting impurities into the semiconductor material.

Figure 10C:
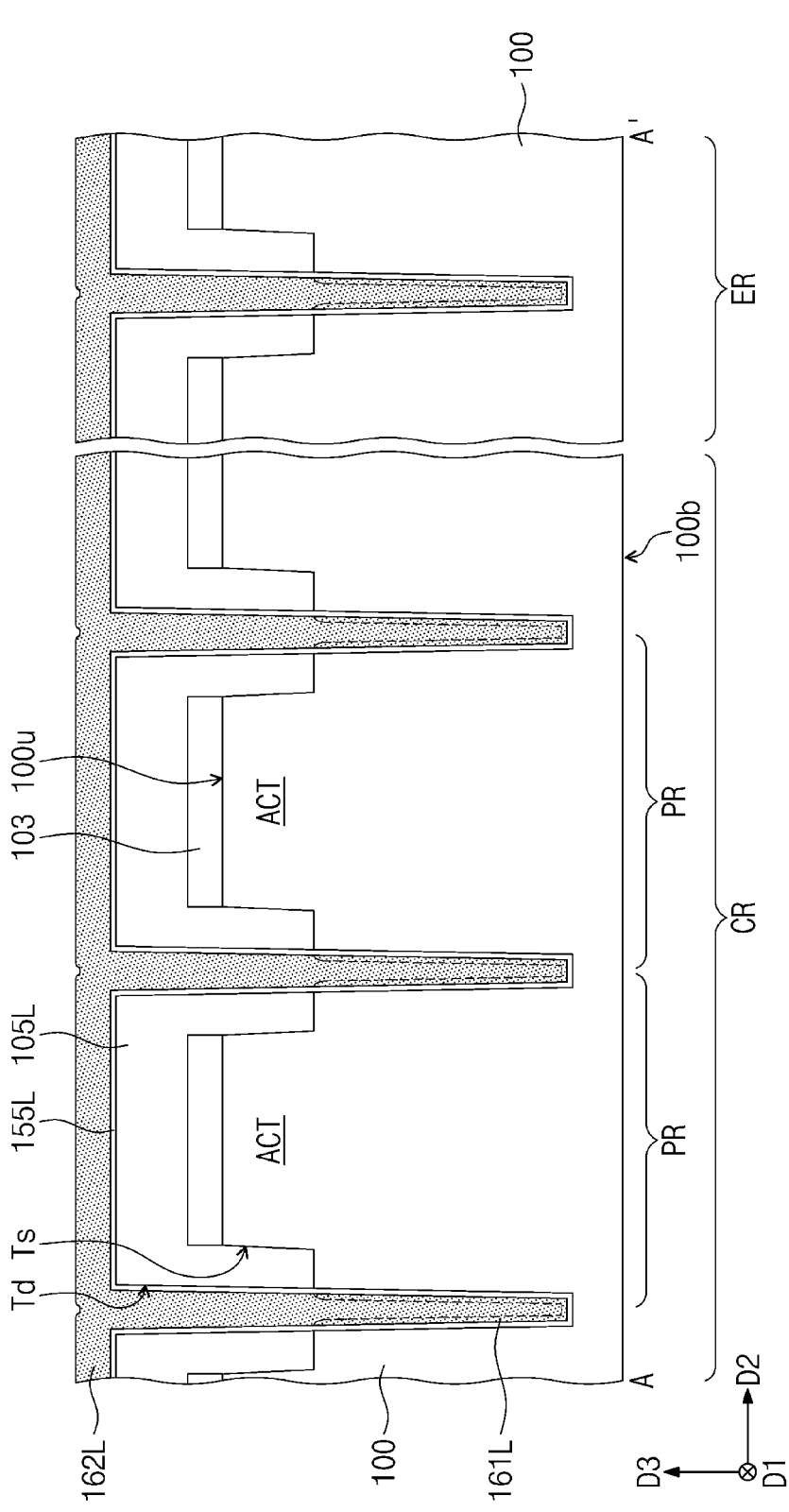

Referring to FIG. 10C, a second sub-semiconductor layer 162L may fill a remaining portion of the deep trench Td. As an example, the second sub-semiconductor layer 162L may be formed to fully fill the remaining portion of the deep trench Td. The second sub-semiconductor layer 162L may cover a top surface of the sidewall insulating layer 155L. The second sub-semiconductor layer 162L may be formed of or include at least one of undoped semiconductor materials. In an exemplary embodiment of the present inventive concept, the second sub-semiconductor layer 162L may be formed of or include undoped poly silicon.

Figure 10D:
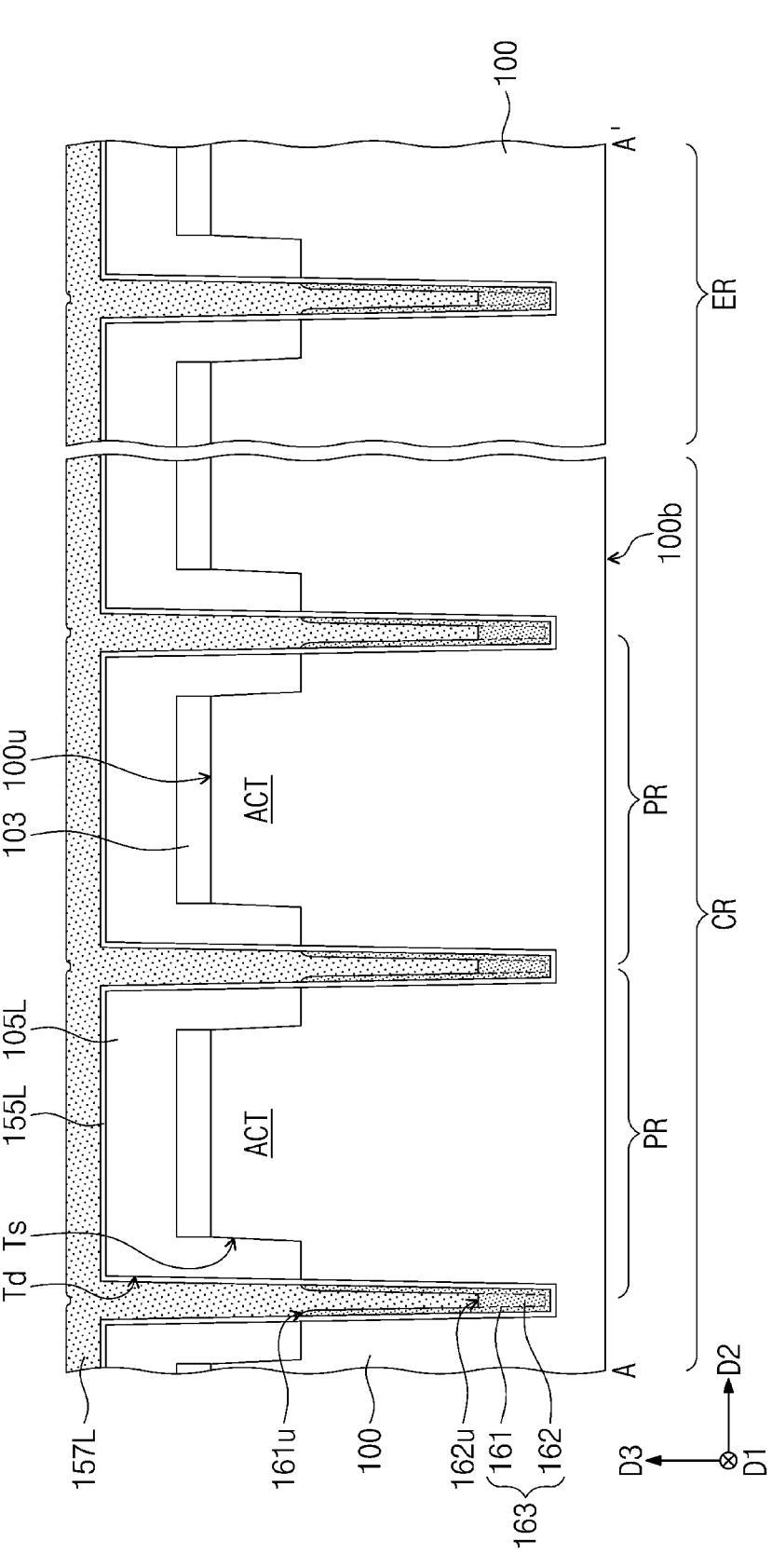

Referring to FIG. 10D, an upper portion of the second sub-semiconductor layer 162L may be removed. The removal process may be performed to leave the second sub-semiconductor layer 162L in only a lower portion of the deep trench Td.

The removal process may include etching the upper portion of the second sub-semiconductor layer 162L. In an exemplary embodiment of the present inventive concept, the etching process may be performed to further remove a portion of the first sub-semiconductor layer 161L. Since there is a difference in impurity doping concentration and consequent etch rate between semiconductor materials, a removal amount of the first sub-semiconductor layer 161L may be less than a removal amount of the second sub-semiconductor layer 162L.

As a result of the removal process, a preliminary semiconductor pattern 163 including a first portion 151 and a second portion 162 may be formed. The first portion 161 and the second portion 162 may be in contact with each other, with an interface therebetween.

After the etching process, a remaining portion of the first sub-semiconductor layer 161L may constitute the first portion 161, and the first portion 161 may cover the sidewall insulating layer 155L in the deep trench Td. The first portion 161 may be placed on an inner side surface of the sidewall insulating layer 155L, and may be extended in the third direction D3 substantially perpendicular to the second surface 100*b*. In addition, the first portion 161 may be extended to a bottom surface of the sidewall insulating layer 155L.

A remaining portion of the second sub-semiconductor layer 162L may constitute the second portion 162, and the second portion 162 may fill a lower portion of the deep trench Td. The second portion 162 may have side and bottom surfaces, which are in contact with the first portion 161, and a top surface 162*u*, which is exposed to the outside. The air gap AG of FIG. 6D may be further formed, during the formation of the second portion 162.

A top surface 161*u* of the first portion 161 may be located at a height higher than the top surface 162*u* of the second portion 162.

An insulating gapfill layer 157L may be formed in the deep trench Td. The insulating gapfill layer 157L may cover the top surface of the sidewall insulating layer 155L. The insulating gapfill layer 157L may fill at least a portion of a remaining portion of the deep trench Td that is not tilled with the preliminary semiconductor pattern 163. As an example, the insulating gapfill layer 157L may be formed to fully fill the remaining portion of the deep trench Td. As another example, the insulating gapfill layer 157L may fill a portion of the deep trench Td, and here, the air gap AG of FIG. 6A may be formed in the deep trench Td. The air gap AG may be formed between the insulating gapfill. layer 157L and the second portion 162.

Figure 10E:
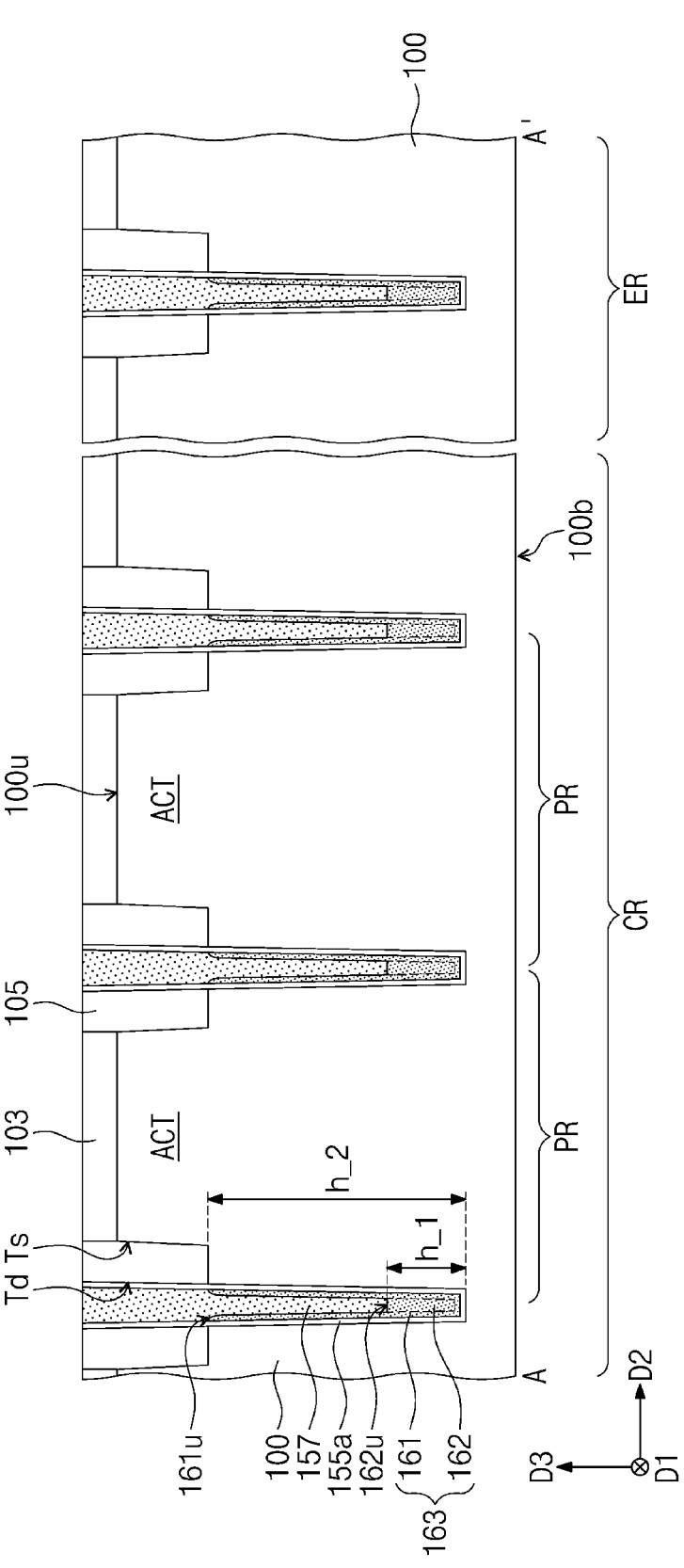

Referring to FIG. 10E, a thermal treatment process may be performed. As a result of the thermal treatment process, p- or n-type impurities in the first portion 161 may be diffused into the semiconductor material of the second portion 162, and in this case, the second portion 162 may have a conductive property. In an exemplary embodiment of the present inventive concept, a portion of the sidewall insulating layer 155L, which is not covered by the preliminary semiconductor pattern 163, may be removed before the thermal treatment process.

A preliminary sidewall insulating pattern 155a, the gapfill insulating pattern 157, and the shallow device isolation pattern 105 may be respectively formed by removing an upper portion of the sidewall insulating layer 155L, an upper portion of the insulating gapfill layer 157L, and an upper portion of the device isolation layer 105L. The removal process may include a planarization process. The first mask pattern 103 may be exposed to the outside, as a result of the removal process.

After the formation of the shallow device isolation pattern 105, a first height h_1 from the bottom surface of the deep trench Td to the top surface 162u of the second portion 162 may be about 10% to about 50% of a second height from the bottom surface of the deep trench Id to the bottom surface 105b of the shallow device isolation pattern 105.

Figure 10F:
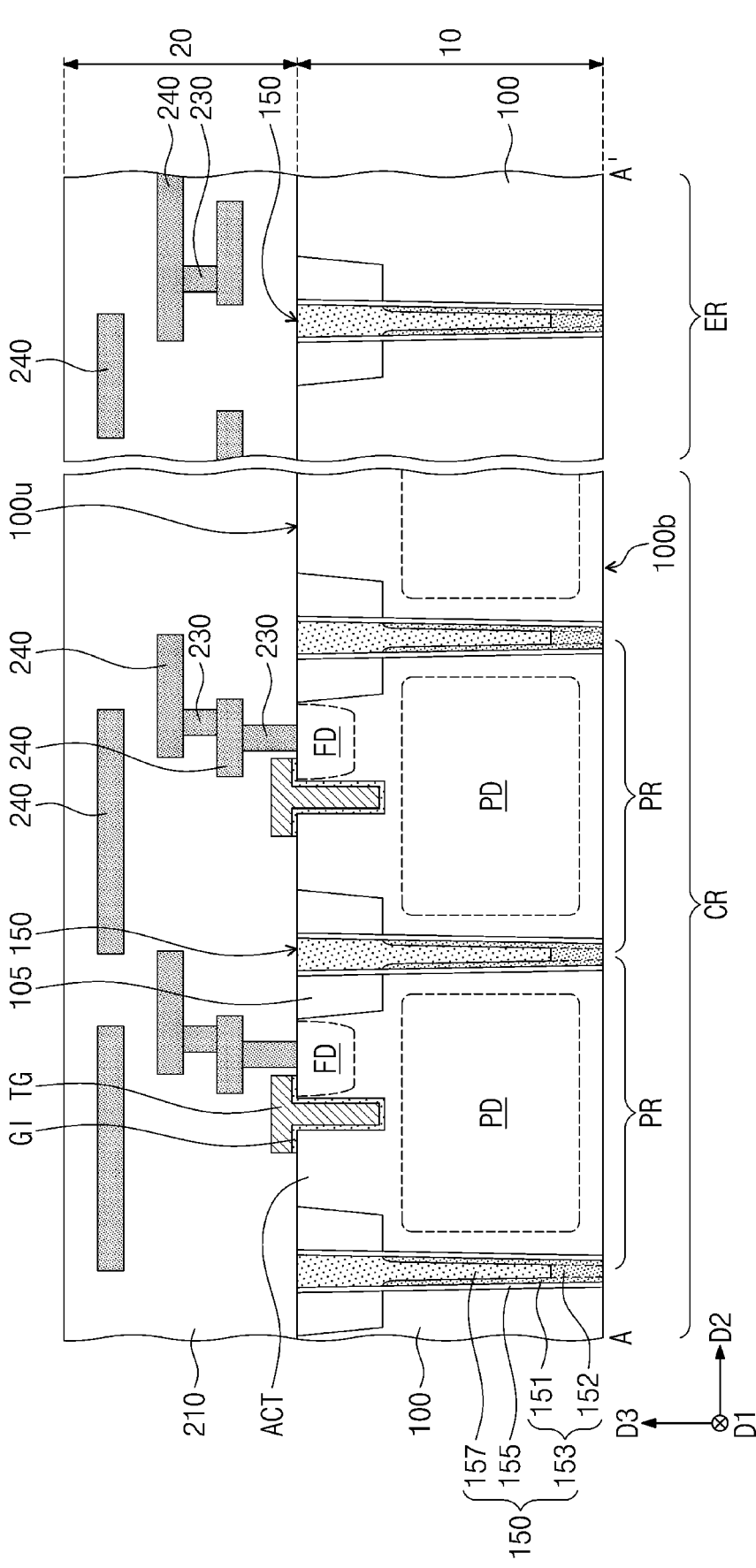

Referring to FIG. 10F, the first mask pattern 103 may be removed. In an exemplary embodiment of the present inventive concept, the removal of the first mask pattern 103 may include etching the first mask pattern 103. Thereafter, an upper portion of the preliminary side wall insulating pattern 155a, an upper portion of the gapfill insulating, pattern 157, and an upper portion of the shallow device isolation pattern 105 may be further removed, and the preliminary sidewall insulating pattern 155a, the gapfill insulating pattern 157, and the shallow device isolation pattern 105 may have top surfaces that are substantially coplanar with the first surface 100u of the substrate 100.

The photoelectric conversion region PD may be formed in the pixel regions PR, respectively. In an exemplary embodiment of the present inventive concept, the formation of the photoelectric con version region PD may include injecting impurities, which are of the second conductivity type (e.g., n-type) different from the first conductivity type (e.g., p-type), into the substrate 100.

A thinning process may be performed on the second surface 100b of the substrate 100, and a portion of the substrate 100 may be removed by the thinning process. The deep device isolation pattern 150 may be formed by the thinning process, and in an exemplary embodiment of the present inventive concept, the deep device isolation pattern 150 may include the semiconductor pattern 153, the sidewall insulating patterns 155, and the gapfill insulating pattern 157.

A lower portion of the preliminary sidewall insulating pattern 155a may be removed by the thinning process, and in this case, the preliminary sidewall insulating pattern 155a may be divided into the sidewall insulating patterns 155.

The semiconductor pattern 153 may be formed from the preliminary semiconductor pattern 163 through the thinning process and may include the sidewall portions 451, which are placed adjacent to the sidewall insulating patterns 155, respectively, and the filling portion 152, which is placed between the sidewall portions 151. The sidewall portions 151 may be a remaining portion of the first portion 161, which is what remains after the thinning process, and the filling portion 152 may be a remaining portion of the second portion 162, which what remains after the thinning process. The deep device isolation pattern 150 may have a bottom surface that is substantially coplanar with the second surface 100b of the substrate 100. The deep device isolation pattern 150 may further include the air gap AG, which is formed in the second portion 162 or between the gapfill insulating pattern 157 and the semiconductor pattern 153.

In an exemplary embodiment of the present inventive concept, the thinning process may include grinding or polishing the second surface 100b of the substrate 100 and anisotropically and/or isotropically etching the second surface 100b of the substrate 100.

In each of the pixel regions PR, the transfer gate electrode TG may be formed on the first surface 100u of the substrate 100, and the floating diffusion region FD may be formed in an upper portion of the substrate 100 near or adjacent to the first surface 100u. As an example, in each of the pixel regions PR, the transfer gate electrode TG may be formed on the active pattern ACT, and the floating diffusion region FD may be formed in an upper portion of the active pattern ACT. The gate dielectric layer GI may be formed between the transfer gate electrode TG and the active pattern ACT.

The photoelectric conversion layer 10 may be formed by the afore-described fabrication process, and then, the interconnection layer 20 may be formed on the first surface 100u. As an example, the interconnection layer 20 may include the interlayer insulating layer 210, which is formed on the first surface 100u of the substrate 100. The interlayer insulating layer 210 may be formed to cover the first surface 100u of the substrate 100, the top surface of the deep device isolation pattern 150, and the top surface of the shallow device isolation pattern 105. The interconnection layer 20 may further include the contact plugs 230 and the conductive lines 240, which are electrically connected to each other.

Referring back to FIG. 4A, the optically-transparent layer 30 may be formed on the second surface 100b of the substrate 100. As an example, the anti-reflection layer 310 and the first insulating layer 312 may be formed on the second surface 100b of the substrate 100 and may be vertically overlapped with the deep device isolation pattern 150. A hole exposing the semiconductor pattern 153 may be formed on the edge region ER by etching the anti-reflection layer 310 and the first insulating layer 312. The contact insulating layer 380 may be formed to cover an inner surface of the hole, and then, the contact pattern CT may be formed to fill a remaining portion of the hole covered with the contact insulating layer 380. The contact pattern CT may include the barrier pattern 360 and the metal pattern 370.

The formation of the contact pattern CT may include forming a barrier layer to conformally cover the hole, forming a contact metal layer on the barrier layer, and etching the barrier layer and the contact metal layer to form the barrier pattern 360 and the metal pattern 370, respectively.

The grid 315 may be formed on the first insulating layer 312 and may be vertically overlapped with the deep device isolation pattern 150. In an exemplary embodiment of the present inventive concept, the formation of the grid 315 may include depositing a metal layer on the first insulating layer 312 and patterning the metal layer.

The color filter array 320 may be formed on the first insulating layer 312 and may cover the grid 315. The color filter array 320 may include a plurality of color filters 320, and the color filters 320 may be disposed on the pixel regions PR, respectively. The second insulating layer may be formed on the color filter array 320, and the micro lens array 330 may be formed on the second insulating layer 322. The micro lens array 330 may include a plurality of micro lens 330 disposed on the color filters 320.

Figure 11A:
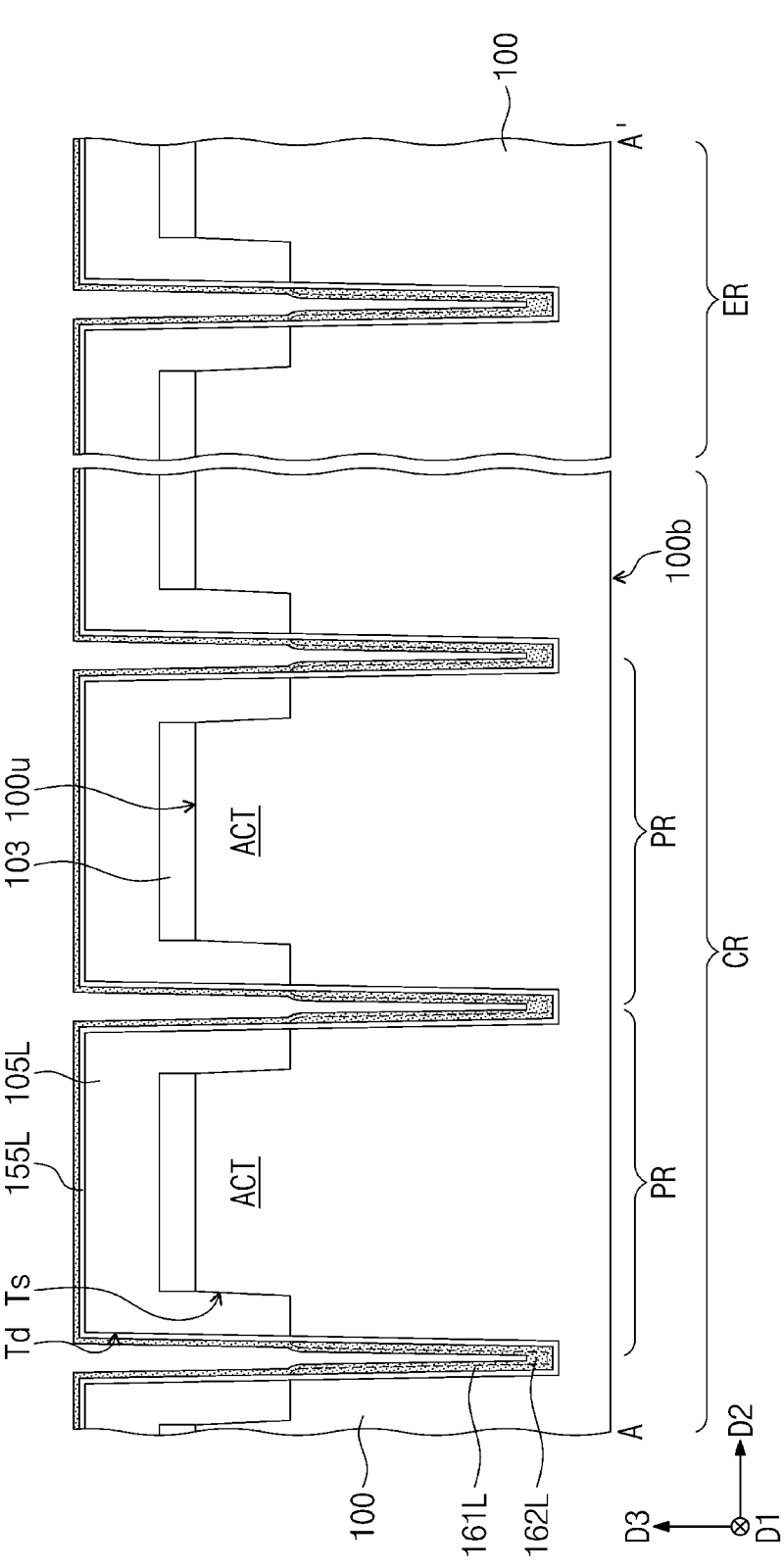
Figure 11B:
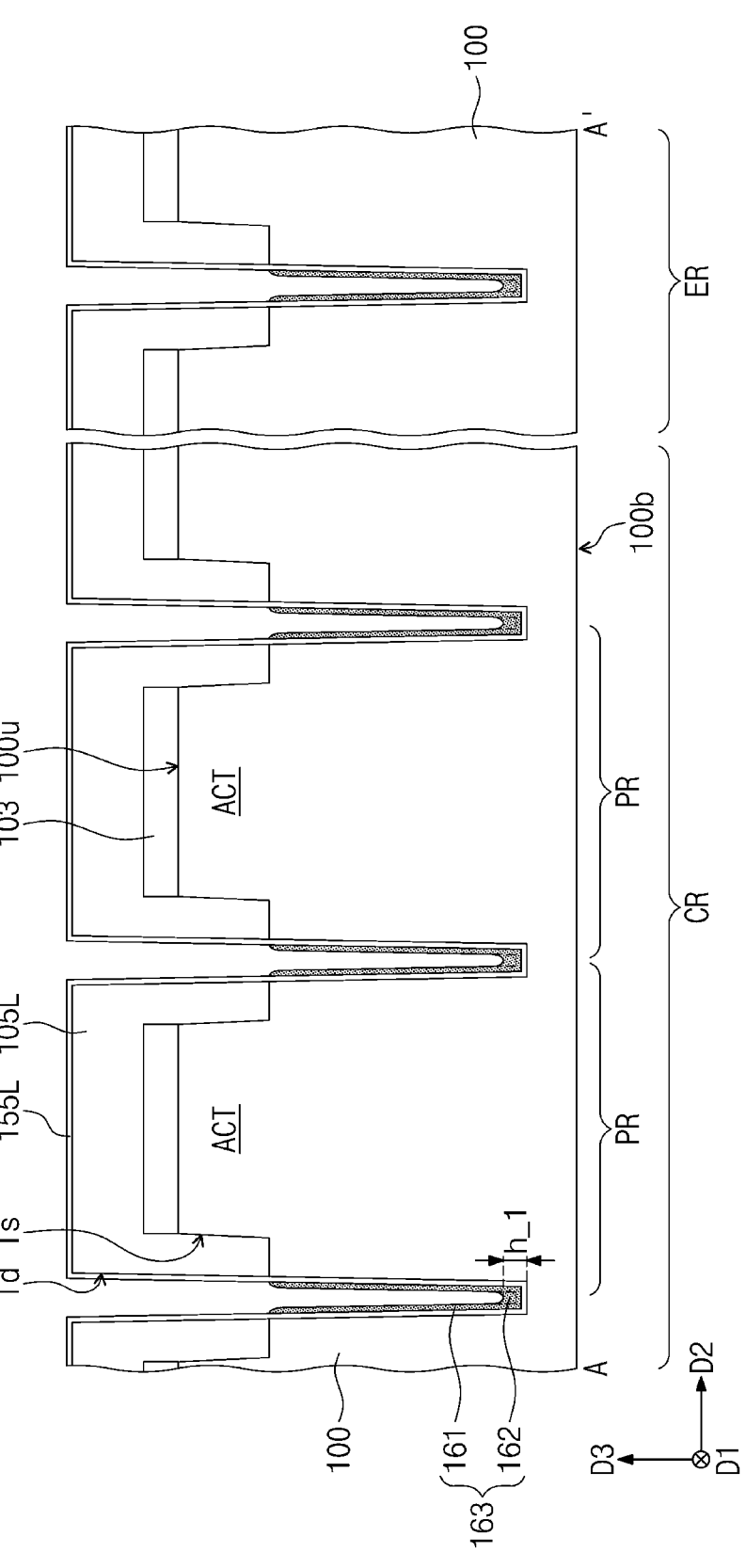
Figure 11C:
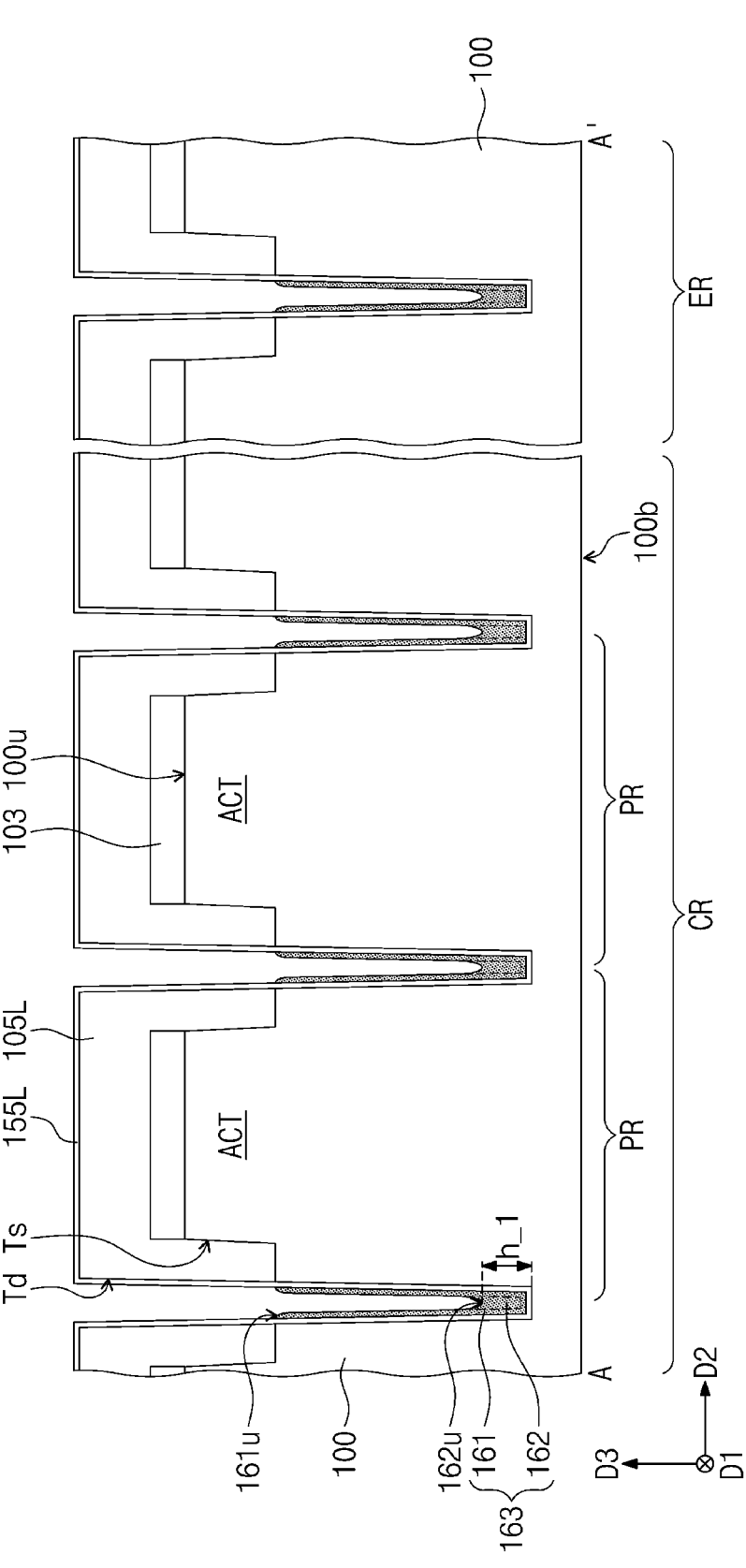

FIGS. 11A to 11C are sectional views, which are taken along the line A-A' of FIG. 3 to illustrate a method of fabricating an image sensor according to an exemplary embodiment of the present inventive concept. For concise description, a previously described element may be identi fied by the same reference number without repeating an overlapping or redundant description thereof.

Referring to FIG. 11A the second sub-semiconductor layer 162L may be formed to conformally cover the first sub-semiconductor layer 161L, after the formation of the first sub-semiconductor layer 161L. The second sub-semiconductor layer 162L may be disposed on the first sub-semiconductor layer 161L and the sidewall insulating layer 155L. For example, the second sub-semiconductor layer 162L may cover the first sub-semiconductor layer 161L and the sidewall insulating layer 155L. The second sub-semiconductor layer 162L may be formed of or include at least one of undoped semiconductor materials.

Referring to FIG. 11B, an upper portion of the second sub-semiconductor layer 162L may be removed. For example, the removal process may be performed. to leave the second sub-semiconductor layer 162L, in a lower portion of the deep trench Td.

As a result of the removal process, the preliminary semiconductor pattern 163 including the first and second portions 161 and 162 may be formed. The first portion 161 and the second portion 162 may overlap each other For example, the first portion 161 and the second portion 162 may be in contact with each other, with an interface therebetween.

A remaining portion of the first sub-semiconductor layer 161L may constitute the first portion 161, and the first portion 161 may cover a portion of the sidewall insulating layer 155L in the deep trench Td. A remaining portion of the second sub-semiconductor layer 162L may constitute the second portion 162, and the second portion 162 may fill a lower portion of the deep trench Td.

Referring to FIG. 11C, the process of forming the preliminary semiconductor pattern 163 described with reference to FIGS. 11A and 11B may be repeated. For example, the process of forming the second sub-semiconductor layer 162L and the process of removing the upper portion of the second sub-semiconductor layer 162L may be performed several times is an alternating manner. Since the processes of forming and removing the second sub-semiconductor layer 162L are repeatedly performed, the second portion 162 may be formed to have an increased volume in the lower portion of the deep trench Td, and the top surface 162$u$ of the second portion 162 may be formed at a higher position. For example, as the forming and removing processes are repeated, the first height h_1 from the bottom surface of the deep trench Td to the top surface 162$u$ of the second portion 162 may be increased.

Thereafter, the processes described with reference to FIGS. 10D to 10E and 4A may be performed to fabricate the image sensor.

Figure 12A:
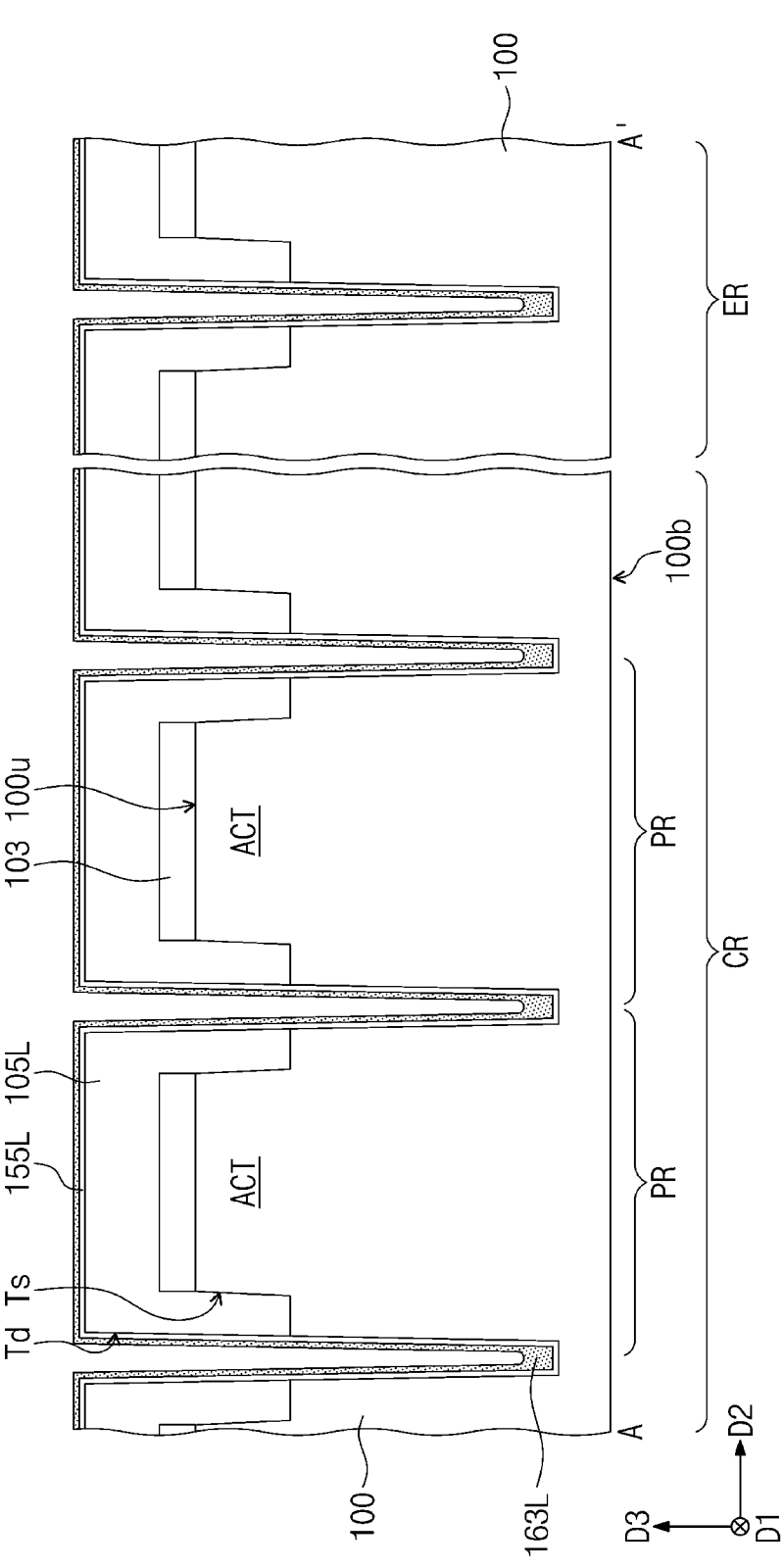
Figure 12B:
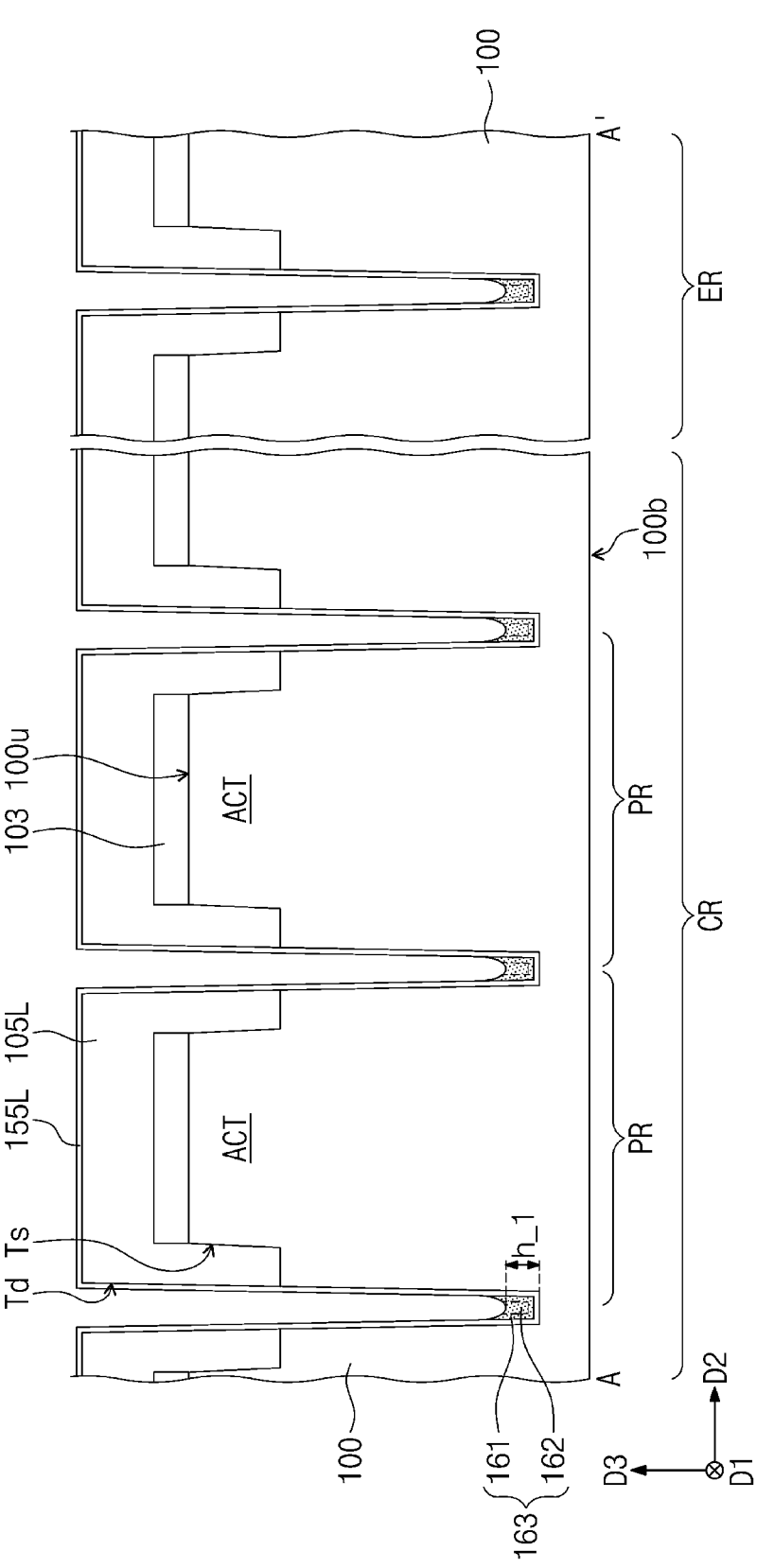
Figure 12C:
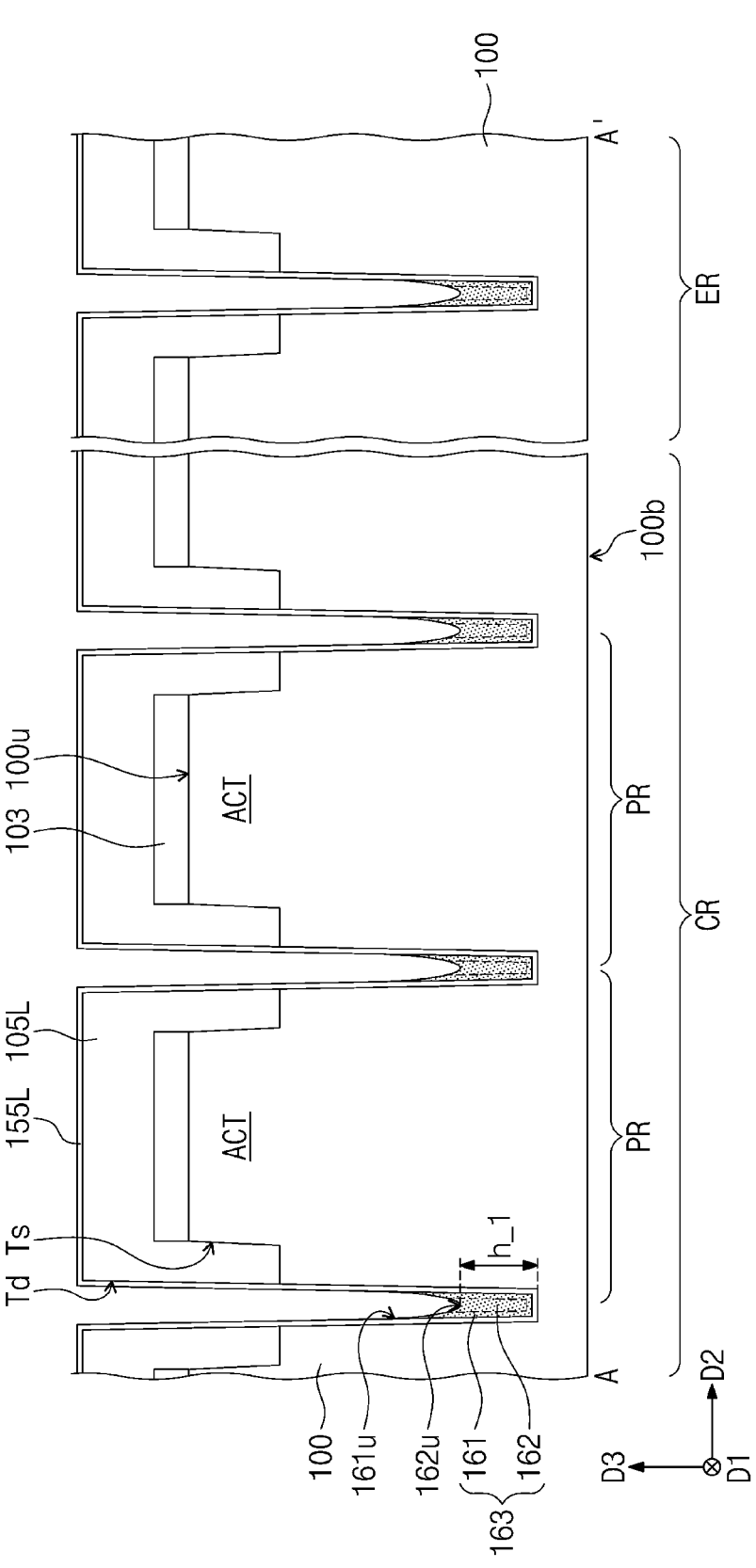

FIGS. 12A to 12C are sectional views, which are taken along the line A-A' of FIG. 3 to illustrate a method of fabricating an image sensor according to an exemplary embodiment of the present inventive concept. For concise description, a previously described element may be identified by the same reference number without repeating an overlapping or redundant description thereof.

Referring to 12A, a preliminary semiconductor layer 163L may be formed to cover inner and top surfaces of the sidewall insulating layer 155L, after the formation of the sidewall insulating layer 155L. The preliminary semiconductor layer 163L may be formed on the sidewall insulating layer 155L and may conformally cover the inner and top surfaces of the sidewall insulating layer 155L. The preliminary semiconductor layer 163L may be formed of or include a semiconductor material, which is doped to have a conductivity type of p- or -type. As an example, the preliminary semiconductor layer 163L may be formed of or include boron-doped poly silicon.

Referring to FIG. 12B, an upper portion of the preliminary semiconductor layer 163L may be removed, and in this case, a remaining portion of the preliminary semiconductor lave 163L may form the preliminary semiconductor pattern 163. For example, the preliminary semiconductor pattern 163 may be formed in the deep trench Td. The preliminary semiconductor pattern 163 may include the first portion 161 and the second portion 162. The first portion 161 may include a portion of the preliminary semiconductor pattern 163, which is placed in the deep trench Td to cover the sidewall insulating layer 155L, and the second portion 162 may include another portion of the preliminary semiconductor pattern 163 filling a lower portion of the deep trench Id. The first portion 161 and the second portion 162 may be in contact with each other, without any interface therebetween.

Referring to FIG. 12C, the process of forming the preliminary semiconductor pattern 163 described with reference to FIGS. 12A and 12B may be repeated. For example, the process of forming the preliminary semiconductor layer 163L and the process of removing the upper portion of the preliminary semiconductor layer 163L may be performed several times in an alternating manner. Since the processes of forming and removing the preliminary semiconductor layer 163L are repeatedly performed, the top surface 161$u$ of the first portion 161 and the top surface 162$u$ of the second portion 162 may be formed at a higher position when being compared to the situation in which the repetition of the processes of forming and removing the preliminary semiconductor layer 163L is not performed. As the forming and removing processes are repeated, the first height h_1 from the bottom surface of the deep trench Td to the top surface 142$u$ of the second portion 162 may be increased.

Thereafter, the processes described with reference to FIGS. 10D to 10E and 4A may be performed to fabricate the image sensor.

Figure 13:
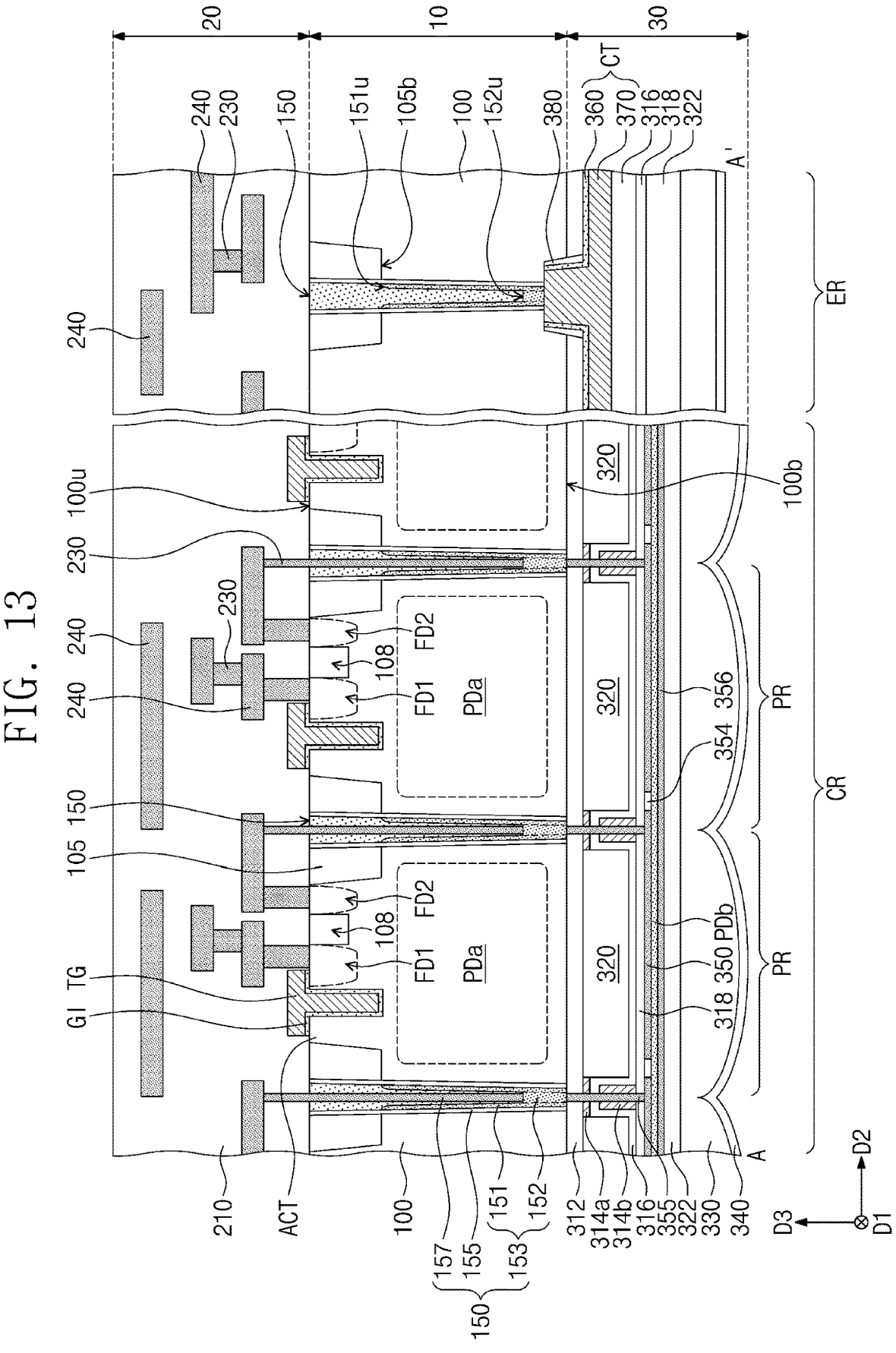
FIG. 13 is a sectional view, which is taken along the line A-A of FIG. 3 to illustrate image sensor according to an exemplary embodiment of the present inventive concept.

FIG. 13 is a sectional view, which is taken along the line A-A' of FIG. 3 to illustrate an image sensor according to an exemplary embodiment of the present inventive concept. For concise description, a previously described element may be identified by the same reference number without repeating an overlapping or redundant description thereof.

Referring to FIG. 13, an insulating isolation pattern 108 may be disposed in the active pattern ACT of each of the pixel regions PR and near or adjacent to the first surface 100$u$. The insulating isolation pattern 108 may be formed of or include at least one of, for example, silicon oxide, silicon nitride, and/or silicon oxynitride.

In each of the pixel regions PR, the transfer gate electrode TG may be disposed on the first surface 100$u$ to cover the active pattern C1, and a first floating diffusion region FD1 may be disposed in an upper portion of the active pattern ACT near or adjacent to the first surface 100$u$. The transfer gate electrode TG and the first floating diffusion region FD1 may constitute the transfer transistor TX of FIG. 2. A second floating diffusion region FD2 may be disposed in an upper portion of the active pattern ACT near or adjacent to the first surface 100$u$ of the substrate and in each of the pixel regions PR. The insulating isolation pattern 108 may be interposed between the first floating diffusion region FD1 and the second floating diffusion region FD2. The first and second floating diffusion regions FD1 and FD2 may be impurity regions, which are doped to have the second conductivity type (e,g., n-type) that is different from the first conductivity type at the substrate 100.

The second floating diffusion region FD2 may be connected to a corresponding one of the contact plugs 230 in the interconnection layer 20. The semiconductor pattern 153 of the deep device isolation pattern 150 may be connected to a corresponding one of the contact plugs 230 that is in the interconnection layer 20. The semiconductor pattern 153 may be electrically connected to the second floating diffusion region FD2 through the corresponding one of the contact plugs 230 and a corresponding one of the conductive lines 240 that is connected to the corresponding contact plug 230.

Each of the pixel regions PR may include a first photoelectric conversion region PDa. The first photoelectric conversion region PDa may be a doped region having the second conductivity type e.g., an n-type) that is different from the first conductivity type of the substrate 100. The first photoelectric conversion region PDa and the substrate 100 may form a p-n junction or a photodiode.

The optically-transparent layer 30 may be disposed on the second surface 100b of the substrate 100. The optically-transparent layer 30 may include the color filter array 320 and the micro lens array 330 disposed on the second surface 100b. The color filter array 320 may be disposed between the second surface 100b of the substrate 100 and the micro lens array 330. The color filter array 320 may include a. plurality of color filters 320, which are disposed on the pixel regions PR, respectively, and the micro lens array 330 may include a plurality of the micro lenses 330 disposed on the color filters 320, respectively.

The first insulating layer 312 may be disposed between the second surface 100b of the substrate 100 and the color filter array 320. Light-blocking patterns 314amay be disposed on the first insulating layer 312 and may be disposed between adjacent color filters 320 of the plurality of color filters 320. Low-refractive patterns 314b may be disposed between adjacent color filters 320 and may be respectively disposed on the light-blocking patterns 314a. A third insulating layer 316 may be interposed between each of the light-blocking patterns 314a and each of the low-refractive patterns 314b and may be extended into a region between each of the color filters 320 and each of the low-refractive patterns 314b. The third insulating layer 316 may extend into a region between each of the color filters 320, and between the color filters 320 and the micro lens array 330. In addition, the third insulating layer 316 may extend from the center region CR to a region in which the contact pattern CT is provided (e.g., in the edge region ER).

Pixel electrodes 350 may be disposed on the pixel regions PR, respectively. The pixel electrodes 350 may be disposed on the color filters 320, respectively, and the third insulating layer 316 may be interposed between the pixel electrodes 350 and the color filters 320. Electrode separation patterns 354 may be disposed between the pixel electrodes 350. A fourth insulating layer 318 may be disposed between the pixel electrodes 350 and the third insulating layer 316 and may be extended into a region between the electrode separation patterns 354 and the low-refractive patterns 314b.

A second photoelectric conversion layer PDb may be disposed on the pixel electrodes 350 and the electrode separation patterns 354, and a common electrode 356 may be disposed on the second photoelectric conversion layer PDb. The second photoelectric conversion layer PDb may be disposed between the pixel electrodes 350 and the common electrode 356 anti between the electrode separation patterns 354 and the common electrode 356. The pixel electrodes 350, the electrode separation patterns 354, the second photoelectric conversion layer PDb, and the common electrode 356 may be disposed between the color filter array 320 and the micro lens array 330. In an exemplary embodiment of the present inventive concept, the second photoelectric conversion layer PDb may be an organic photoelectric conversion layer. The second photoelectric conversion layer PDb may include a p-type organic semiconductor material and an n-type organic semiconductor material, and in this case, the p- and n-type organic semiconductor materials may form a p-n junction. In addition, the second photoelectric conversion layer PDb may be formed of or include at least one of quantum dots or chalcogenide materials. The pixel electrodes 350 and the common electrode 356 may be formed of or include at least one of, for example, indium tin oxide (ITO), indium zinc oxide (IZO), zinc oxide (ZnO), and/or organic transparent conductive materials.

Each of the pixel electrodes 350 may be electrically connected to the semiconductor pattern 153 of the deep device isolation pattern 150 through a via plug 355. The via plug 355 may be connected to the semiconductor pattern 153, and in an exemplary embodiment of the present inventive concept, it may be provided to penetrate the first insulating layer 312, a corresponding one of the light-blocking patterns 314a, the third insulating layer 316, a corresponding one of the low-refractive patterns 314b, and the fourth insulating layer 318. Further, the via plug 355 may be connected to a corresponding one of the pixel, electrodes 350, The second insulating layer 322 may be interposed between the common electrode 356 and the micro lens array 330. The first to fourth insulating layers 312, 316, 318, and 322 and the electrode separation patterns 354 may be formed of or include at least one of, for example, silicon oxide, silicon nitride, and/or silicon oxynitride.

Figure 14:
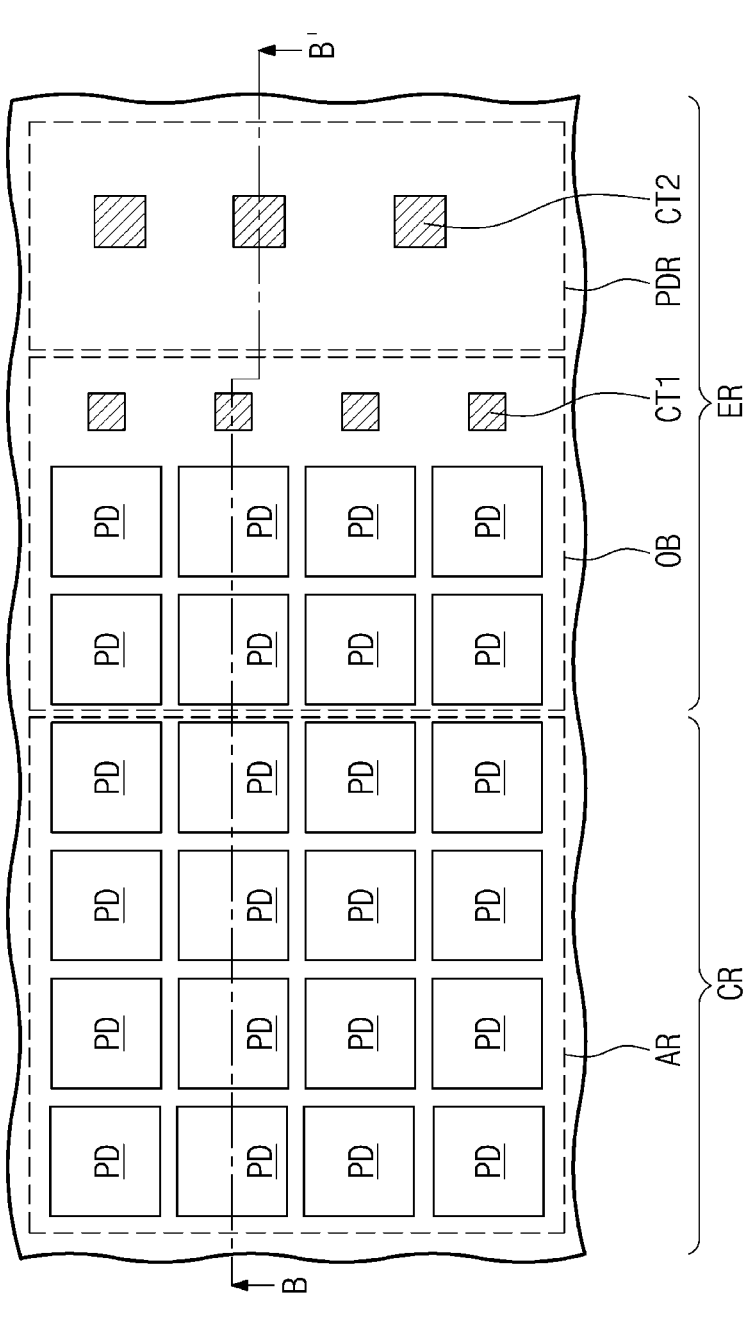
FIG. 14 is a plan view illustrating an image sensor according, to an exemplary embodiment of the present inventive concept.
Figure 15:
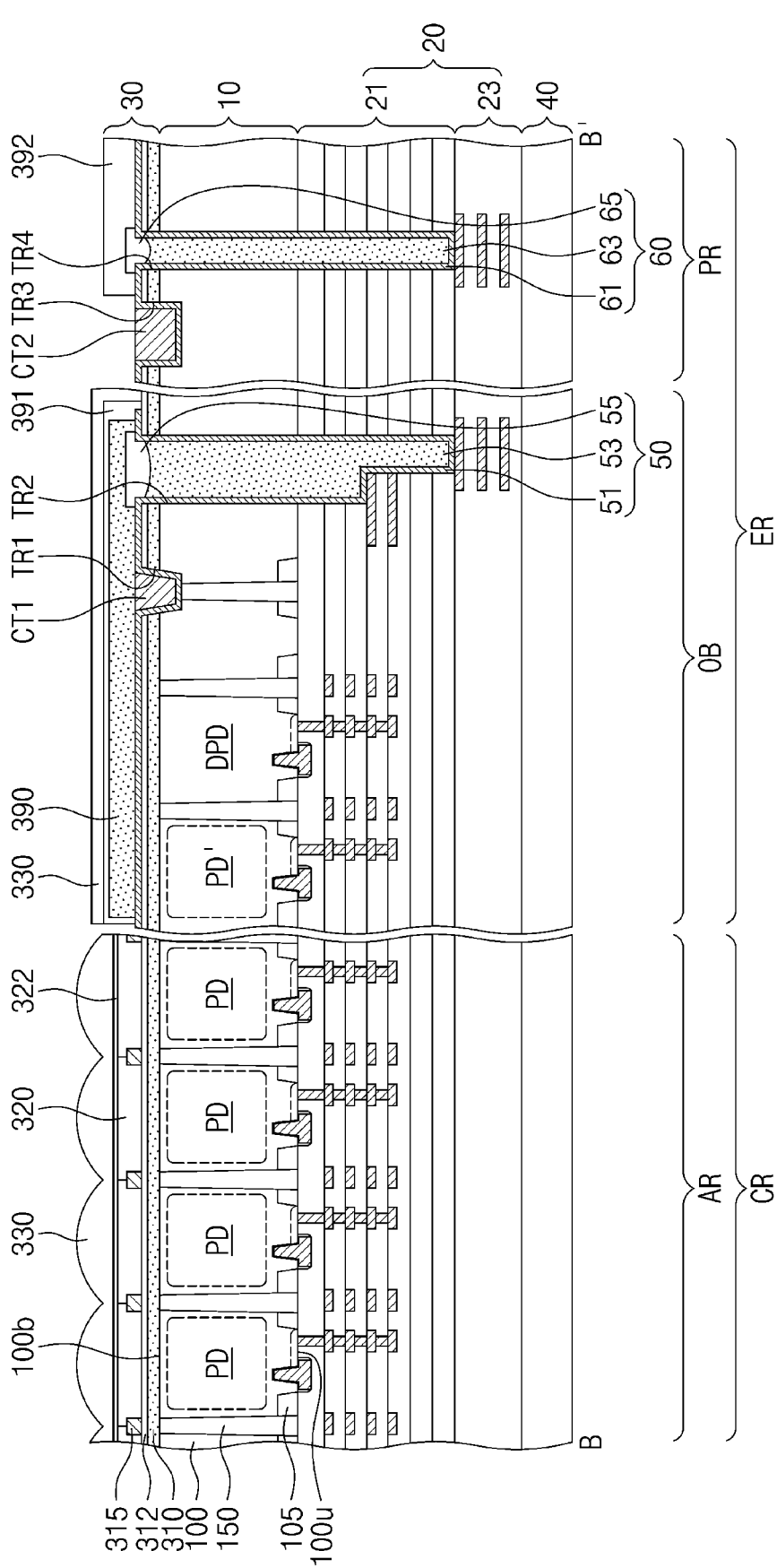
FIG. 15 is a sectional view taken along a line B-B' of FIG. 14.

FIG. 14 is a plan view illustrating an image sensor according to an exemplary embodiment of the present inventive concept. FIG. 15 is a sectional view, which is taken along a line B-B' of FIG. 14. Hereinafter, the entire structure of the image sensor according to an exemplary embodiment of the present inventive concept will be schematically described. For concise description, a previously described element may be identified by the same reference number without repeating an overlapping or redundant description thereof.

Referring to FIGS. 14 and 15, an image sensor may include the substrate 100 including a pixel array region AR, an optical black region OB, and a pad region PDR. The image sensor may additionally include the interconnection layer 20 disposed on the first surface 100u of the substrate 100, a base substrate 40 disposed on the interconnection layer 20, and the optically-transparent layer 30 disposed on the second surface 100b of the substrate 100. The center region CR of FIG. 4A may include the pixel array region AR, and the edge region ER of FIG. 4A may include the optical black region OB and the pad region PDR.

The interconnection layer 20 may be disposed between the first surface 100u and the base substrate 40. The interconnection layer .20 may include an upper interconnection line layer 21, which is adjacent to the first surface 100u, and a lower interconnection line layer 23, which is provided between the upper interconnection line layer 21 and the base substrate 40. The pixel array region AR may include the pixel regions PR and the deep device isolation pattern 150 disposed therebetween. The pixel array region AR may further include the anti-reflection layer 310 and the first insulating layer 312, which are disposed on the second surface 100b. The anti-reflection layer 310 and the first insulating layer 312 may be disposed between the second surface 100*b* and the grid pattern 315.

A first connection structure 50, a first contact CT1, and the bulk color filter 390 may be disposed on the optical black region OH of the substrate 100. The first connection structure 50 may include a first light-blocking pattern 51, a first isolation pattern 53, and a first capping, pattern 55. The first light-blocking pattern 51 may be disposed on the second surface 100*b*. The first light-blocking pattern 51 may cover the first insulating layer 312 and may conformally cover an inner surface of each of a first trench TR1 and a second trench TR2. The first light-blocking pattern 51 may be provided to penetrate the photoelectric conversion layer 10 and the upper interconnection line layer 21 The first light-blocking pattern 51 may be connected to the semiconductor pat€err 153 of the deep device isolation pattern 150 of the photoelectric conversion layer 10 and may be connected to interconnection lines in the upper and lower interconnection line layers 21 and 23. Accordingly, the first connection structure 50 may electrically connect the photoelectric conversion layer 10 to the interconnection layer 20. The first light-blocking pattern 51 may be formed of or include at least one metallic material (e.g., tungsten). The first light blocking pattern 51 may block light, which is incident into the optical black region OB.

The first contact CT1 may be substantially the same as the contact pattern CT of HG. 4A. The first contact CT1 may fill a remaining portion of the first trench TR1. The first contact CT1 may be formed of or include at least one metallic material (e.g., aluminum). The first contact CT1 may be connected to semiconductor patterns 153 of a deep device isolation pattern 150. A bias may be applied to the semiconductor pattern 153 through the first contact CT1. The first isolation pattern 53 may fill a remaining portion of the second trench TR2. The first isolation pattern 53 may be provided to penetrate the photoelectric conversion layer 10 and a portion of the interconnection layer 20. The first isolation pattern 53 may be formed of or include at least one insulating material. The first capping pattern 55 may be disposed on the first isolation pattern 53. The first capping pattern 55 may be formed of or include the same material as the gapfill insulating pattern 157 of the deep device isolation pattern 150.

The bulk color filter 390 may be disposed on the first connection structure 50 and the first contact CT1. The bulk. color filter 390 may cover the first connection structure 50 and the first contact CT1. The first protection layer 391 may be formed on the bulk color filter 390 to seal the bulk color filter 390.

An additional photoelectric conversion region PD' and a dummy region DPD may be provided in corresponding ones of the pixel regions PR of the optical black region OB. The additional photoelectric conversion region PD' may be a doped region having the second conductivity type (e.g., an n-type) that is different from the first conductivity type of the substrate 100. The additional photoelectric conversion region PD' may have a structure that is similar to the photoelectric conversion regions PD, which are provided in the pixel regions PR of the pixel array region AR but may be configured not to perform the operation of generating electrical signals from light, unlike the photoelectric conversion regions PD in the pixel array region AR. The dummy region DPD might not be doped with impurities.

A second connection structure 60, a second contact CT2, and a second protection layer 392 may be disposed on the pad region PDR of the substrate 100. The second connection structure 60 may include a second light-blocking pattern 61, a second isolation pattern 63, and a second capping pattern 65.

The second light-blocking pattern 61 may be disposed on the second surface 100*b* of the substrate 100. The second light-blocking pattern 61 may cover the first insulating layer 312 and may conformally cover an inner surface of each of third and fourth trenches TR3 and TR4. The second light-blocking pattern 61 may be provided to penetrate the photoelectric conversion layer 10 and the upper interconnection line layer 21. The second light-blocking pattern 61 may be connected to the interconnection lines in the lower interconnection line layer 23. Accordingly, the second connection structure 60 may electrically connect the photoelectric conversion layer 10 and the interconnection layer 20 to each other. The second light-blocking pattern 61 may be formed of or include at least one metallic material (e.g., tungsten). The second light-blocking pattern 61 may block light which is incident into the pad region PDR.

The second contact CT2 may be provided to fill a remaining portion of the third trench TR3. The second contact CT2 may be formed of or include at least one metallic material aluminum). The second contact CT2 may serve as an electric connection path between the image sensor and an external device. The second isolation pattern 63 may fill a remaining portion of the fourth trench TR4. The second isolation pattern 63 may penetrate the photoelectric conversion layer 10 and may penetrate a portion of the interconnection layer 20. The second isolation pattern 63 may be formed of or include an insulating material. The second capping pattern 65 may be disposed on the second isolation pattern 63. The second capping pattern 65 may be formed of or include the same material as the gapfill insulating pattern 157 of the deep device isolation pattern 150. The second protection layer 392 may cover the second connection structure 60.

A current, which is applied through the second contact CT2, may be delivered to the semiconductor pattern 153 of the deep device isolation pattern 150 through the second light-blocking pattern 61, the interconnection lines in the interconnection layer 20, and the first light-blocking pattern 51, Electrical signals, which are generated from the photoelectric conversion regions PD in the pixel regions PR of the pixel array region AR, may be transmitted to the outside through the interconnection lines in the interconnection layer 20, the second light-blocking pattern 61, and the second contact CT2.

According to an exemplary embodiment of the present inventive concept, in the deep device isolation pattern 150. the top surface 152*u* of the filling portion 152 of the semiconductor pattern 153 may be located at a height lower'than he top surface 151*u* of the sidewall portion 151. The gapfill insulating pattern 157 and/or the air gap AG may be disposed on the top surface 152*u* of the filling portion 152. This may make it possible to reduce a volume of the filling portion 152, which has relatively high optical absorptivity, and to increase a volume of the gapfill insulating pattern 157 and/or the air gap AG, which has relatively high total reflection efficiency, in the deep device isolation pattern 150. Thus, it may be possible to increase total reflection efficiency of the deep device isolation pattern 150 and thereby increase optical efficiency of an image sensor, In addition, the filling portion 152 may be disposed adjacent to the second surface 100*b* of the substrate 100, whereas the sidewall portion 151 may have a shape elongated in the third direction D3. Accordingly, by applying a negative bias voltage to the contact pattern CT, it may be possible to produce a current flow passing through the sidewall portion 151 having a conductive property, and in this case, it may be possible to prevent a white spot issue or a dark current issue in the image sensor.

According to an exemplary embodiment of the inventive concept, in a deep device isolation pattern, a top surface of a filling portion of a semiconductor pattern may be located at a height lower than a top surface of a sidewall portion. A gapfill insulating pattern and/or an air gap may be disposed on the top surface of the filling portion. This may make it possible to reduce a volume of the filling portion, which has relatively high optical absorptivity, increase a volume of the gapfill insulating pattern and/or the air gap, which has a relatively high total reflection efficiency, in the deep device isolation pattern. Thus, it may be possible to increase total reflection efficiency of the deep device isolation pattern and thereby increase optical efficiency of an image sensor.

In addition, the filling portion may be disposed adjacent to a second surface of a substrate, whereas the sidewall portion may have a shape elongated in a third direction substantially perpendicular to the second surface. Accordingly, by applying a negative bias voltage to a contact pattern, it may be possible to produce a current flow passing through the sidewall portion having a conductive property, and in this case, it may be possible to prevent or suppress a white spot issue or a dark current issue from occurring in the image sensor.

While the present inventive concept have been particularly shown and described with reference to example embodiments thereof it will be apparent to those of ordinary skill in the art that various changes in form and detail ma be made thereto without departing from the spirit and scope of the present inventive concept.

What is claimed is:

1. An image sensor, comprising
a substrate including a plurality of pixel regions, a first surface and a second surface opposite to the first surface, and
a deep device isolation pattern disposed between adjacent pixel regions of the plurality of pixel regions and penetrating the substrate,
wherein the deep device isolation pattern comprises:
a semiconductor pattern extended from the second surface toward the first surface; and
sidewall insulating patterns interposed between the semiconductor pattern and the substrate,
wherein the semiconductor pattern comprises sidewall portions and a filling portion, wherein the sidewall portions are provided adjacent to the sidewall insulating patterns, respectively, wherein the filling portion is provided between the sidewall portions,
wherein top surfaces of the sidewall portions are located at a height higher than a top surface of the filling portion,
wherein the deep device isolation pattern further comprises a gapfill insulating pattern extending from the first surface of the substrate toward the second surface of the substrate, a portion of the gapfill insulating pattern being disposed between the sidewall portions,
wherein the gapfill insulating pattern includes a first portion disposed between the sidewall portions and a second portion covering the top surfaces of the sidewall portions, and
wherein the first portion and second portion of the gapfill insulating pattern are connected to each other continuously.

2. The image sensor of claim 1, wherein each of the sidewall portions and the filling portion comprises a semiconductor material doped to have a conductivity type of p- or n-type.

3. The image sensor of claim 1, wherein the deep device isolation pattern further comprises an air gap, wherein the air gap is interposed between the gapfill insulating pattern and the semiconductor pattern.

4. The image sensor of claim 3, wherein the air gap is provided to expose a bottom surface of the gapfill insulating pattern.

5. The image sensor of claim 1, wherein the deep device isolation pattern further comprises an air gap disposed in the filling portion.

6. The image sensor of claim 1, further comprising a shallow device isolation pattern penetrating the substrate from the first surface of the substrate,
wherein the top surfaces of the sidewall portions are located at a height which is higher or lower than a bottom surface of the shallow device isolation pattern.

7. The image sensor of claim 1, wherein the top surface of the filling portion has a flat or concave shape.

8. The image sensor of claim 1, further comprising a back-side device isolation pattern penetrating the substrate from the second surface of the substrate,
wherein the back-side device isolation pattern is vertically overlapped with the deep device isolation pattern.

9. The image sensor of claim 1, wherein the substrate further comprises a center region and an edge region, wherein the center region includes the plurality of pixel regions, and the edge region is adjacent to the center region, and
wherein the image sensor further comprises a contact pattern penetrating the substrate from the second surface of the substrate and is in contact with a bottom surface of the semiconductor pattern in the edge region.

10. The image sensor of claim 1, wherein the sidewall insulating patterns are a single layer including silicon oxide or is a multiple layer structure including silicon oxide.

* * * * *